US012635124B2

(12) United States Patent
Karda et al.

(10) Patent No.: US 12,635,124 B2
(45) Date of Patent: May 19, 2026

(54) VERTICALLY STACKED STORAGE NODES AND ACCESS DEVICES WITH VERTICAL ACCESS LINES

(71) Applicant: Micron Technology, Inc., Boise, ID (US)

(72) Inventors: Kamal M. Karda, Boise, ID (US); Si-Woo Lee, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 867 days.

(21) Appl. No.: 17/891,839

(22) Filed: Aug. 19, 2022

(65) Prior Publication Data

US 2024/0064956 A1     Feb. 22, 2024

(51) Int. Cl.
*H10B 12/00*          (2023.01)

(52) U.S. Cl.
CPC ............. *H10B 12/30* (2023.02); *H10B 12/05* (2023.02)

(58) Field of Classification Search
CPC ...... H10B 12/03; H10B 12/30; H10B 12/033; H10B 12/31; H10B 12/036; H10B 12/33; H10B 12/318; H10B 53/20; H10D 88/00
See application file for complete search history.

(56) References Cited

U.S. PATENT DOCUMENTS

| | | | |
|---|---|---|---|
| 10,607,995 B2 | 3/2020 | Roberts et al. | |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2021/0013226 A1 | 1/2021 | Tang et al. | |
| 2022/0102358 A1* | 3/2022 | Park | H10B 12/03 |
| 2022/0199635 A1* | 6/2022 | Shivaraman | H10B 53/20 |
| 2022/0246619 A1* | 8/2022 | Kim | H10B 12/50 |

* cited by examiner

*Primary Examiner* — Jay C Kim
*Assistant Examiner* — John Lin
(74) *Attorney, Agent, or Firm* — Brooks, Cameron & Huebsch, PLLC

(57)          ABSTRACT

Systems, methods and apparatus are provided for an array of vertically stacked memory cells. The vertically stacked memory cells have horizontally oriented access devices having a first source/drain region, a channel region, and a second source drain and horizontally oriented storage nodes that are vertically separated from the access devices. Vertically oriented gates are separated from the respective channel regions by gate dielectrics, and horizontally oriented digit lines are coupled to respective first source/drain regions. The horizontally oriented storage nodes each have a first electrode coupled to the second source/drain regions of the access devices and each first electrode opposes two different sides of the horizontal access devices including an electrical contact with a vertical side of the second source/drain regions.

17 Claims, 37 Drawing Sheets

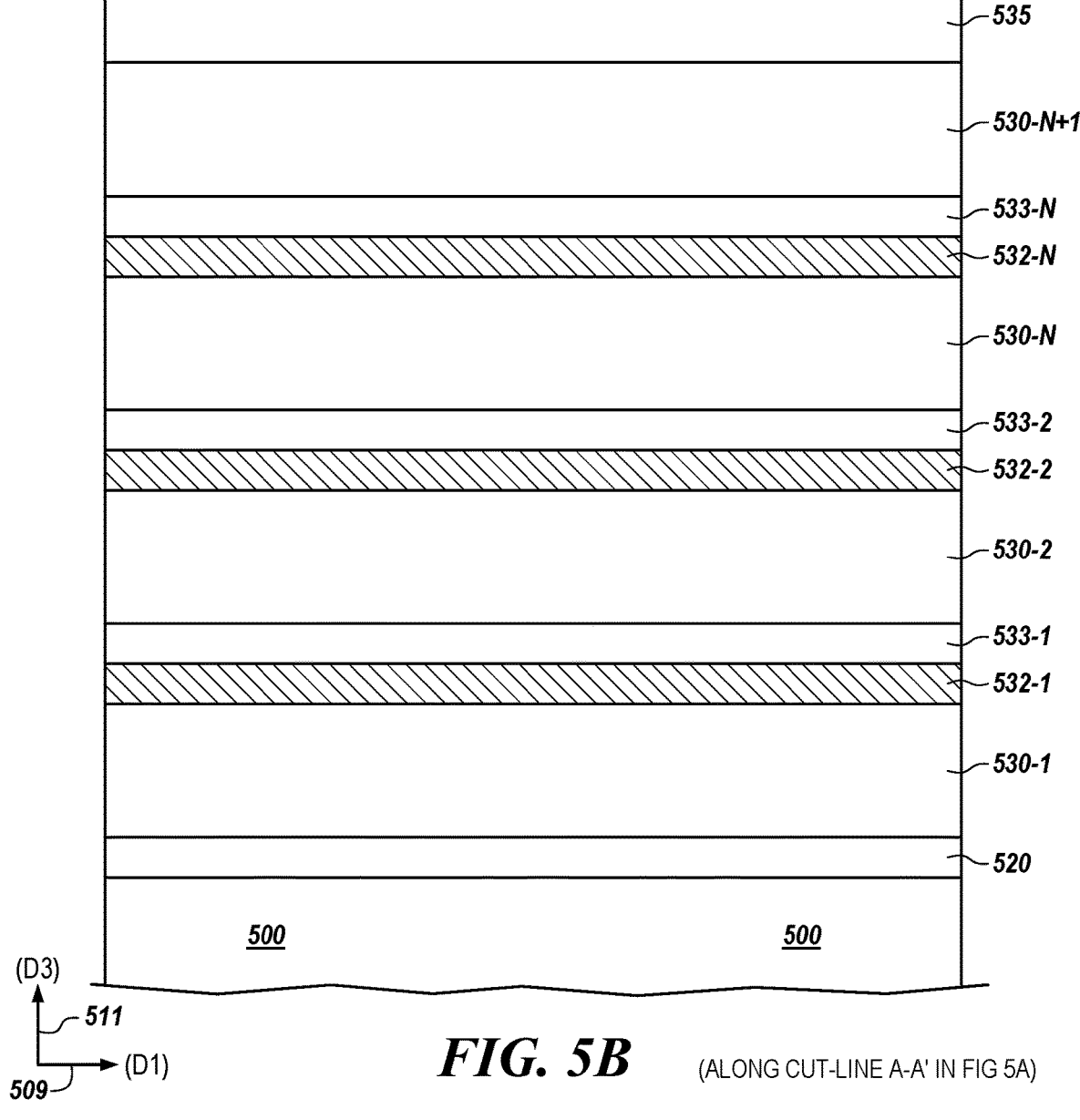
*FIG. 5B*     (ALONG CUT-LINE A-A' IN FIG 5A)

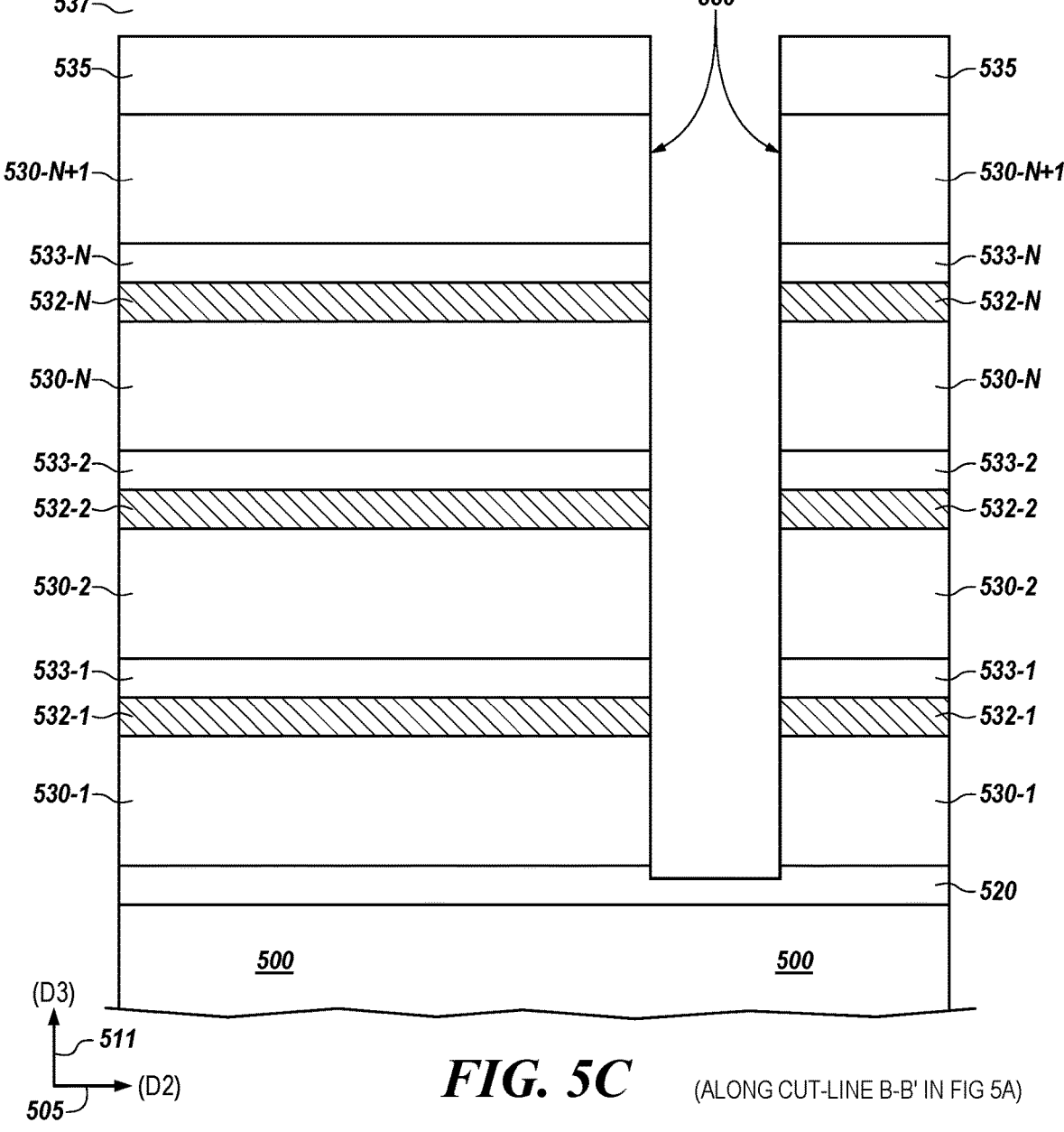
FIG. 5C     (ALONG CUT-LINE B-B' IN FIG 5A)

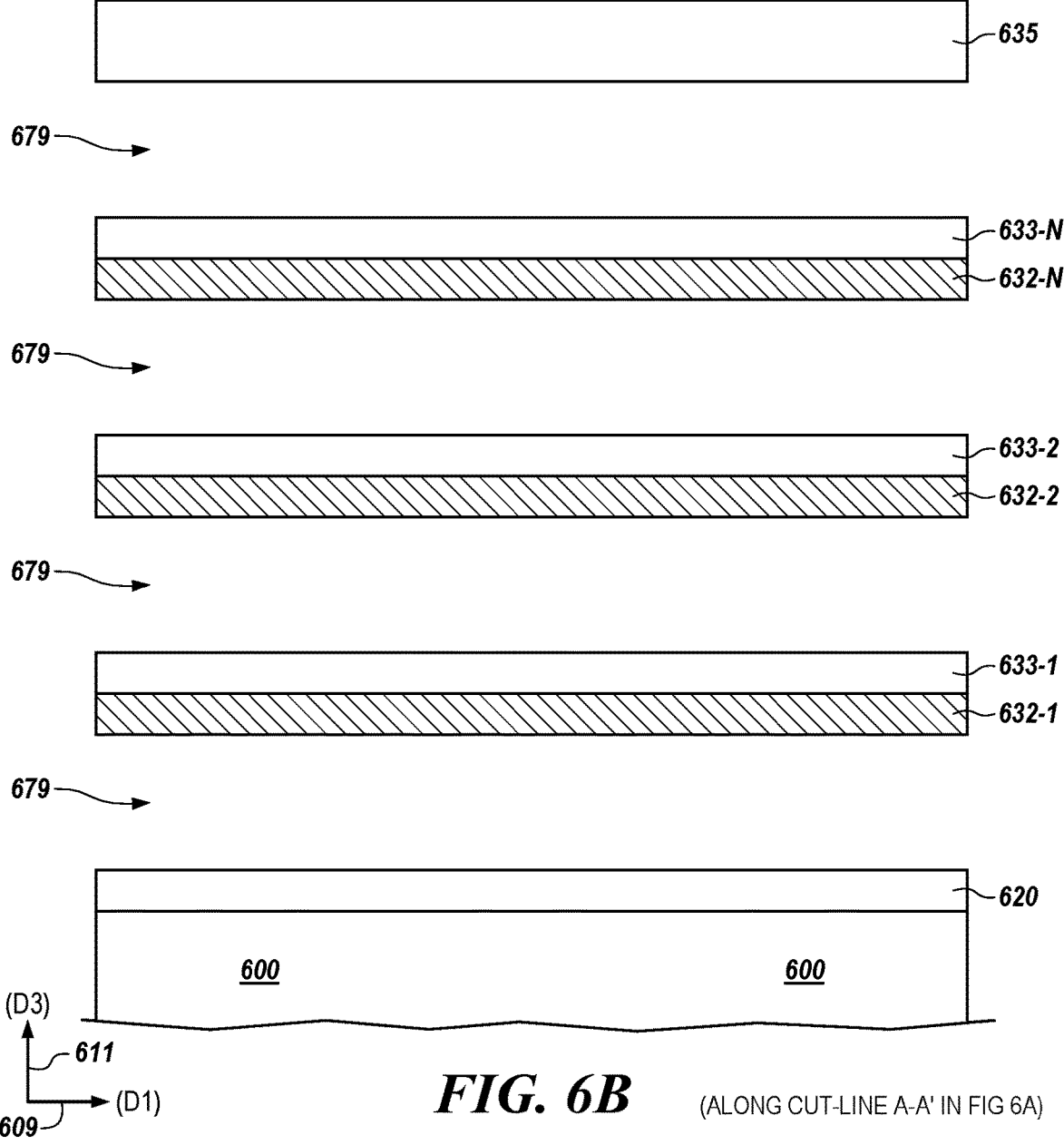
FIG. 6B      (ALONG CUT-LINE A-A' IN FIG 6A)

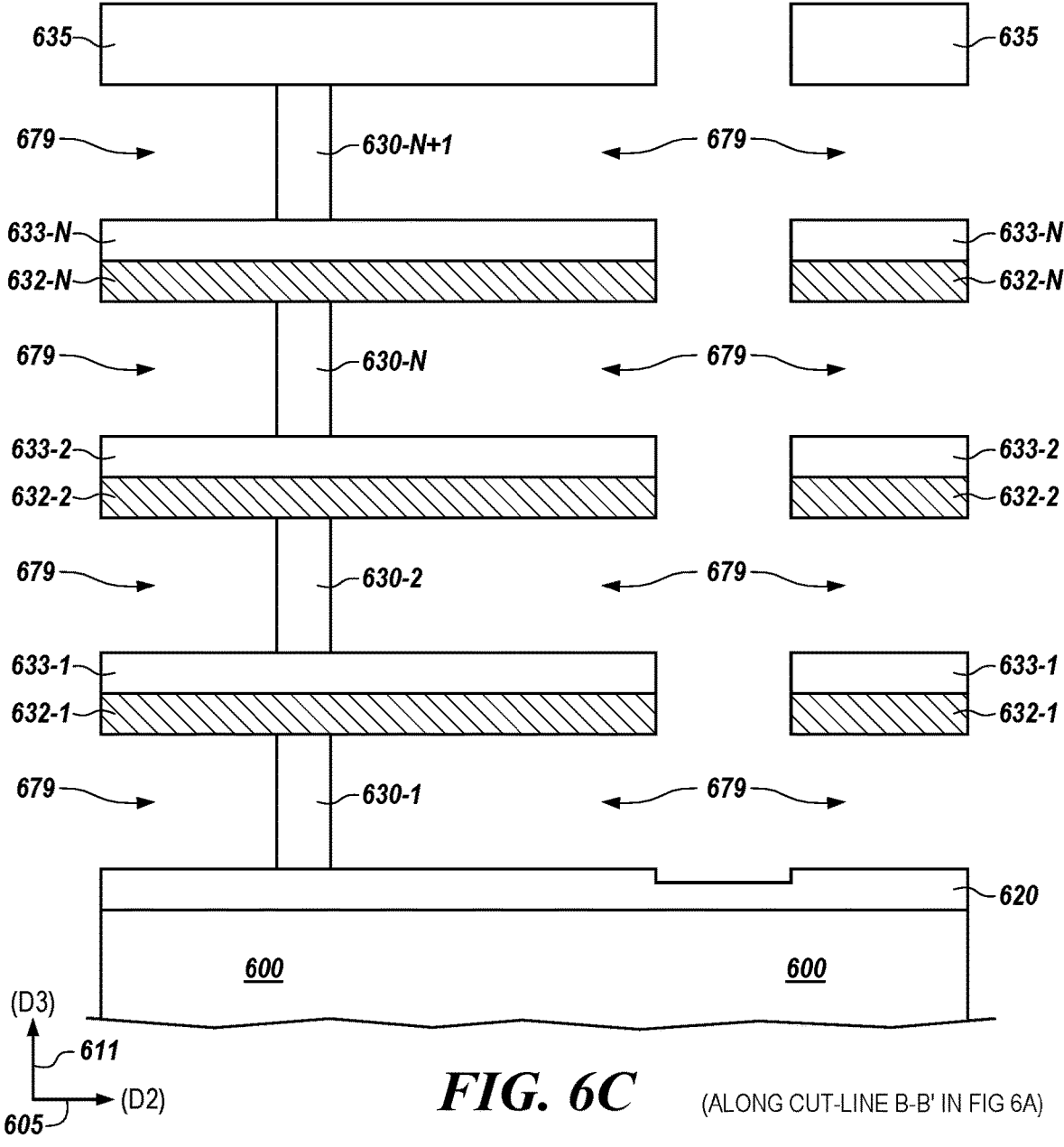
FIG. 6C     (ALONG CUT-LINE B-B' IN FIG 6A)

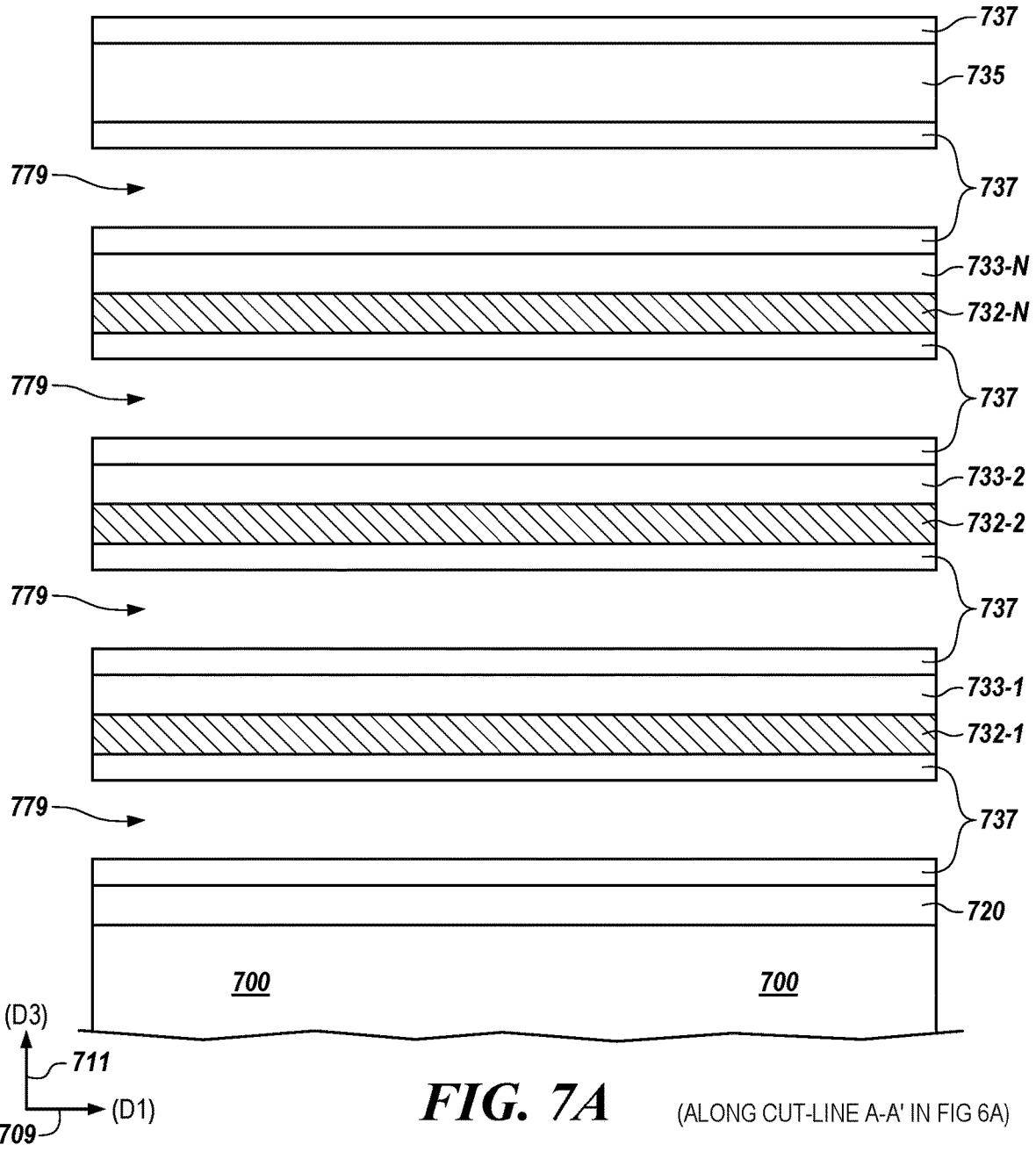
FIG. 7A    (ALONG CUT-LINE A-A' IN FIG 6A)

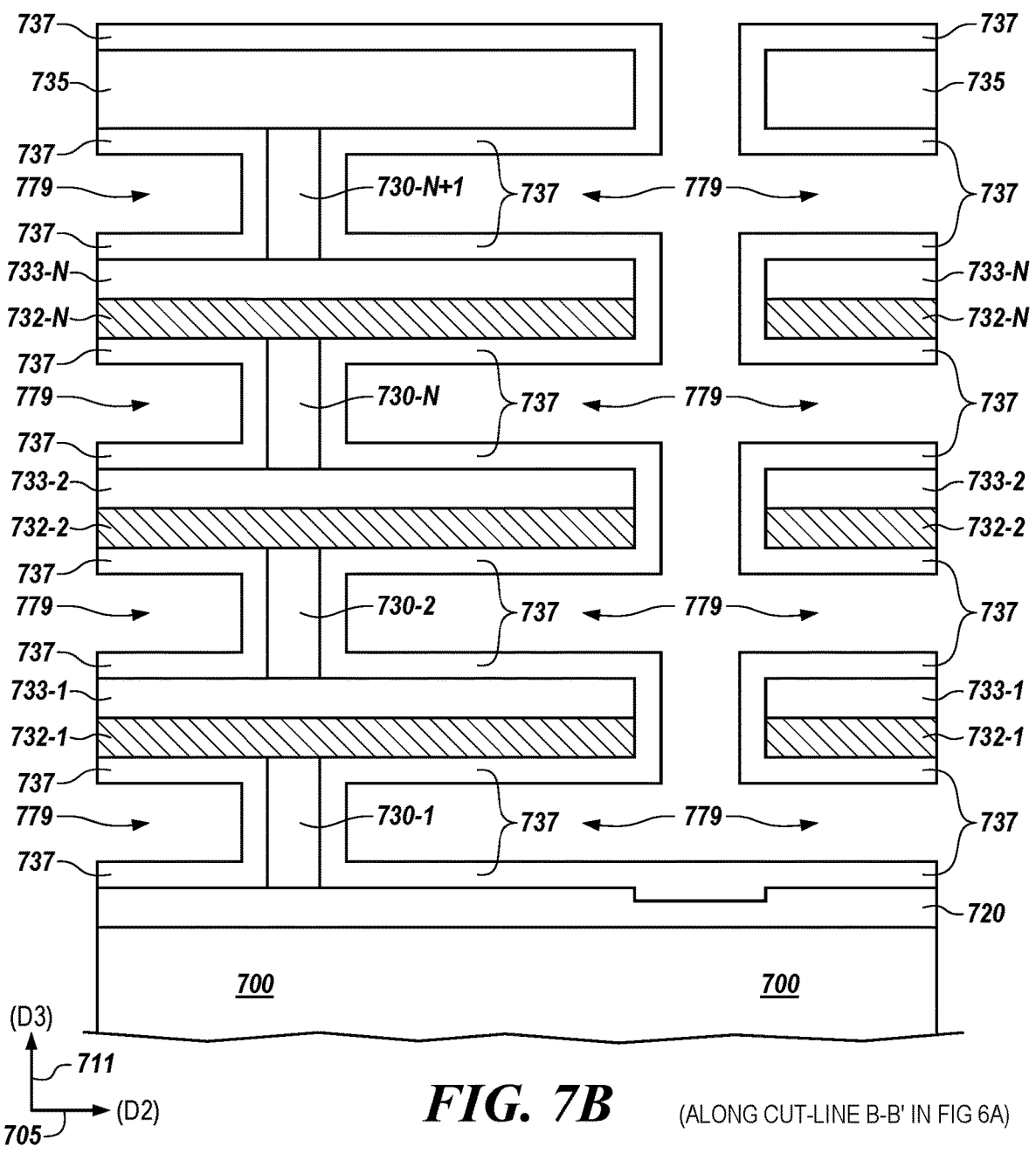
*FIG. 7B*    (ALONG CUT-LINE B-B' IN FIG 6A)

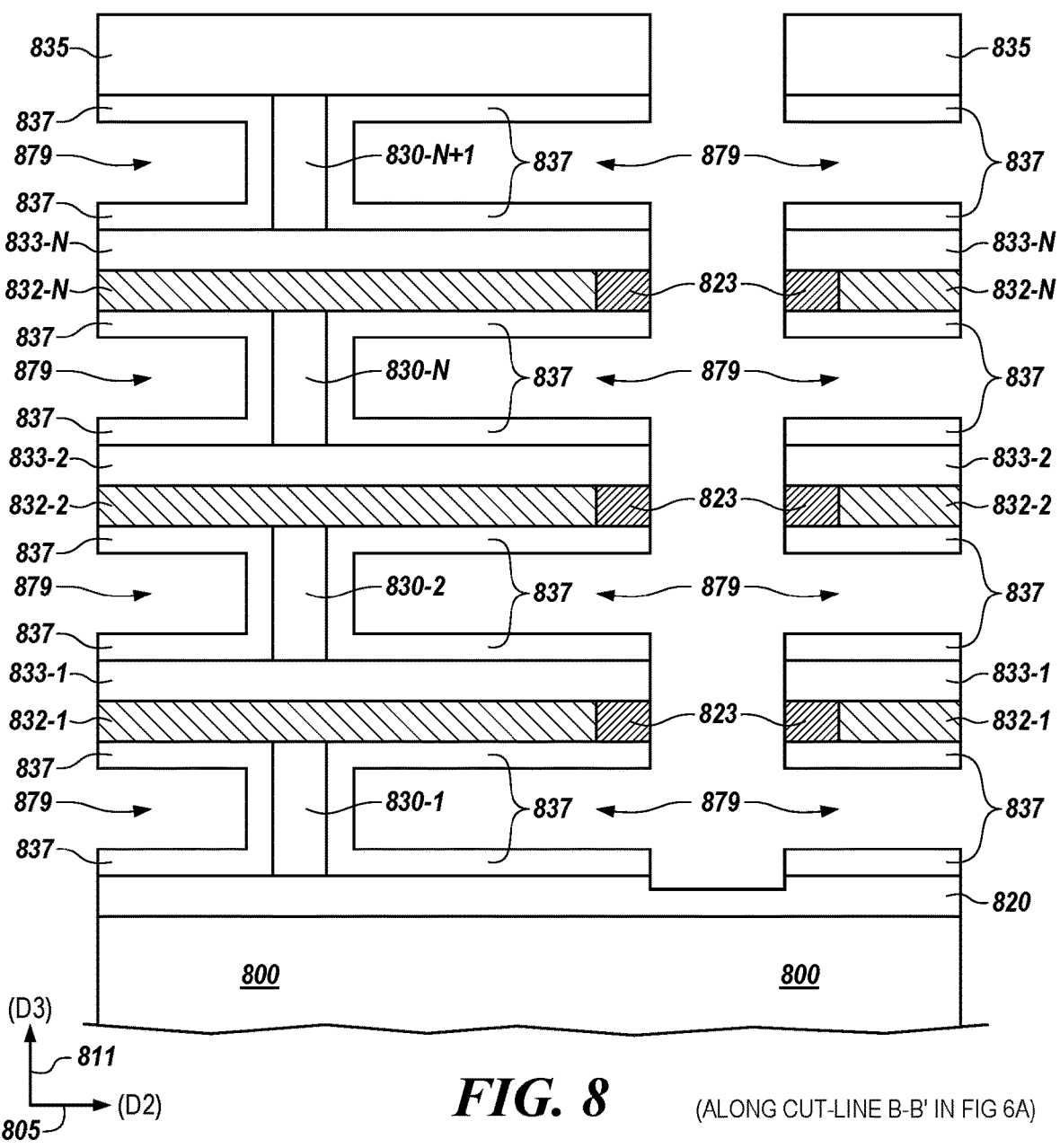
FIG. 8          (ALONG CUT-LINE B-B' IN FIG 6A)

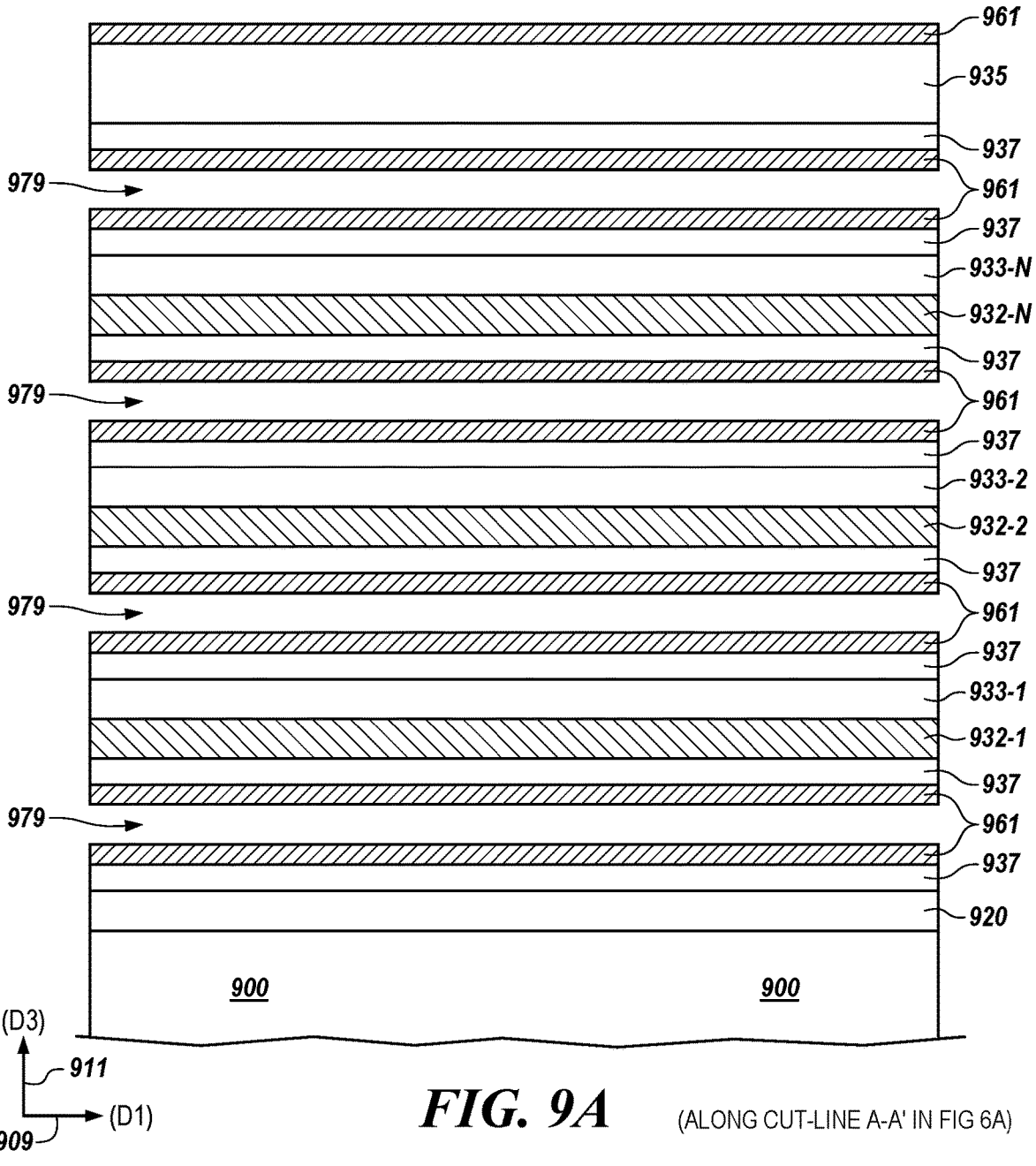
FIG. 9A     (ALONG CUT-LINE A-A' IN FIG 6A)

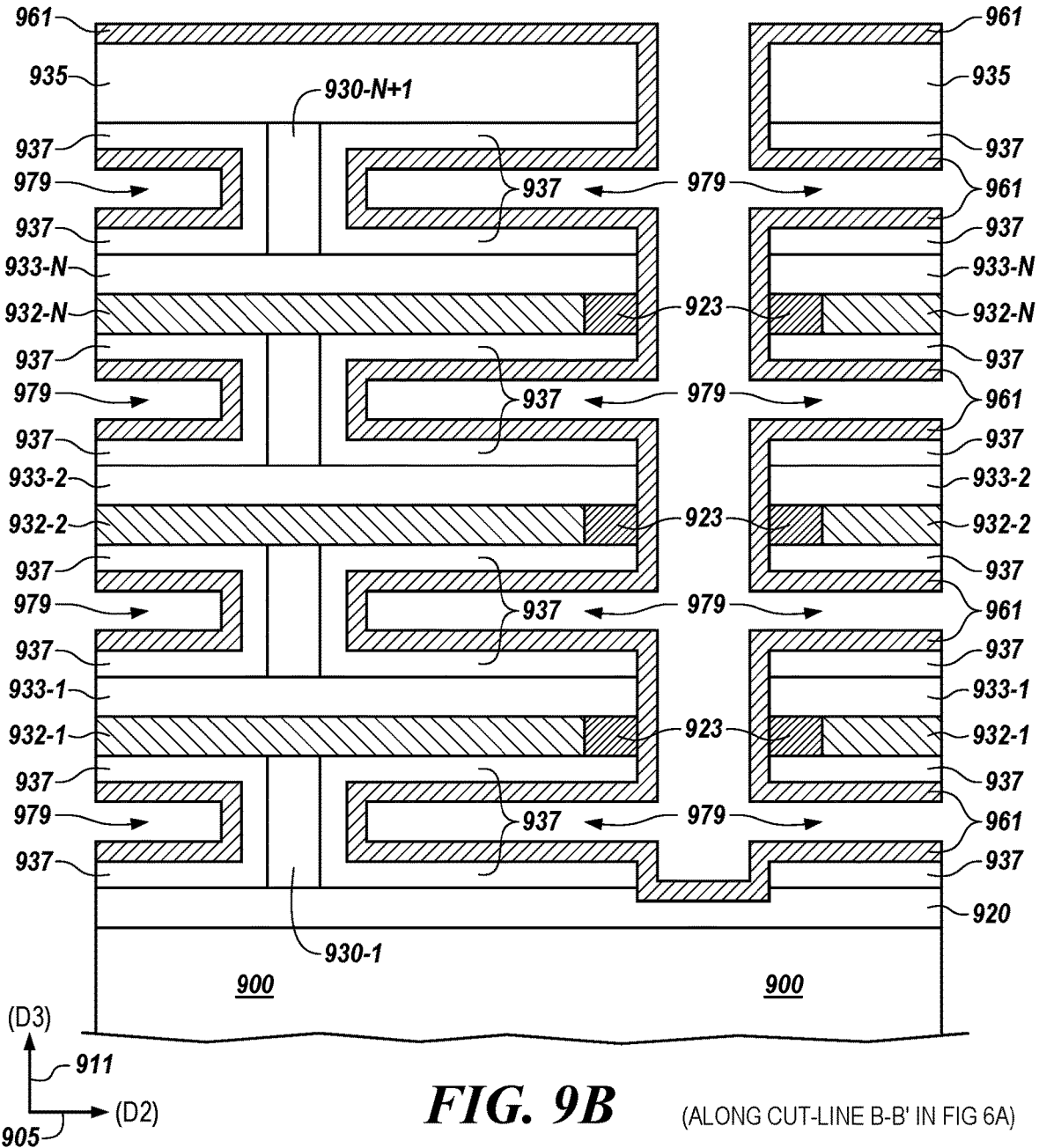
FIG. 9B (ALONG CUT-LINE B-B' IN FIG 6A)

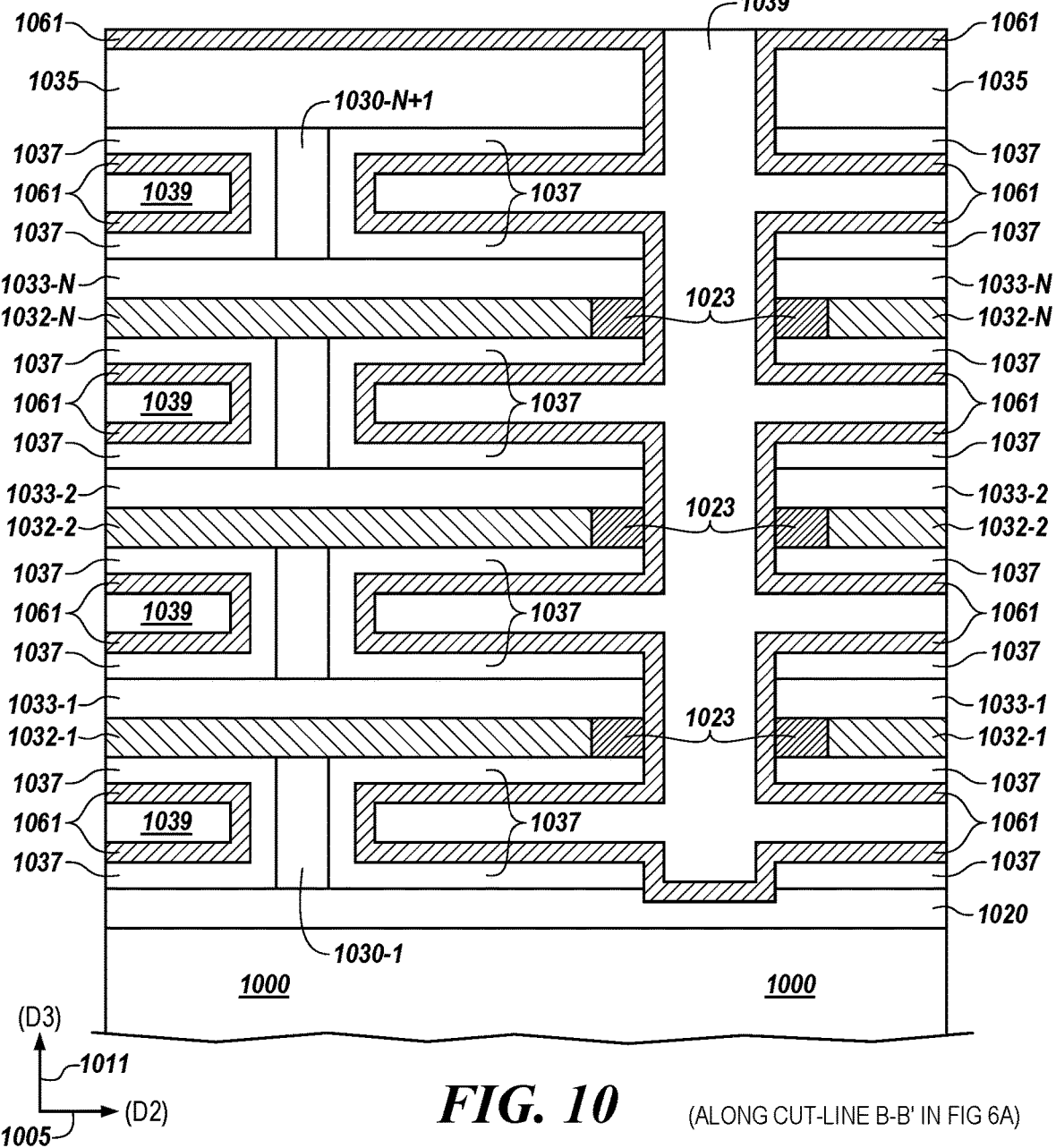
*FIG. 10*    (ALONG CUT-LINE B-B' IN FIG 6A)

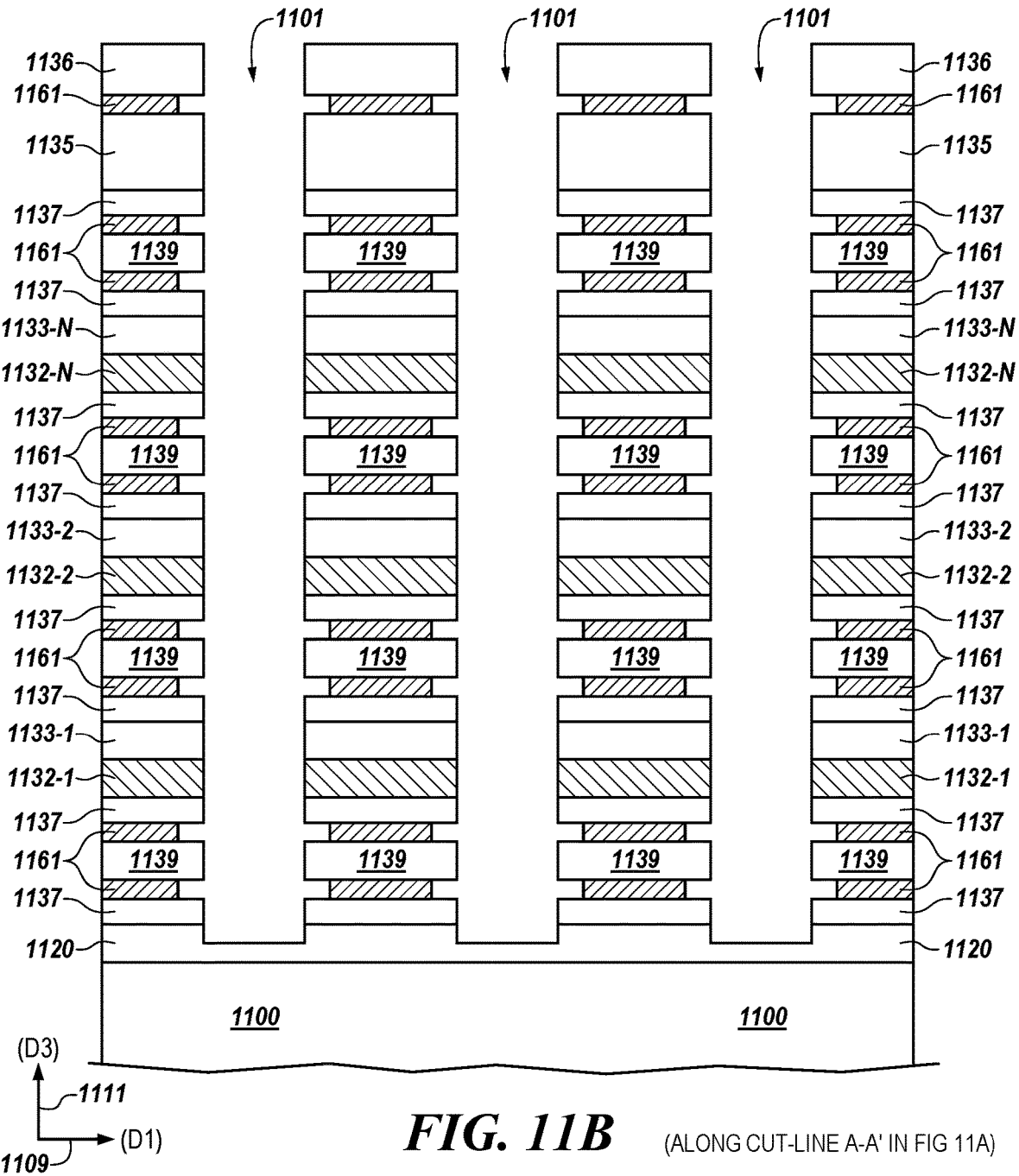
FIG. 11B    (ALONG CUT-LINE A-A' IN FIG 11A)

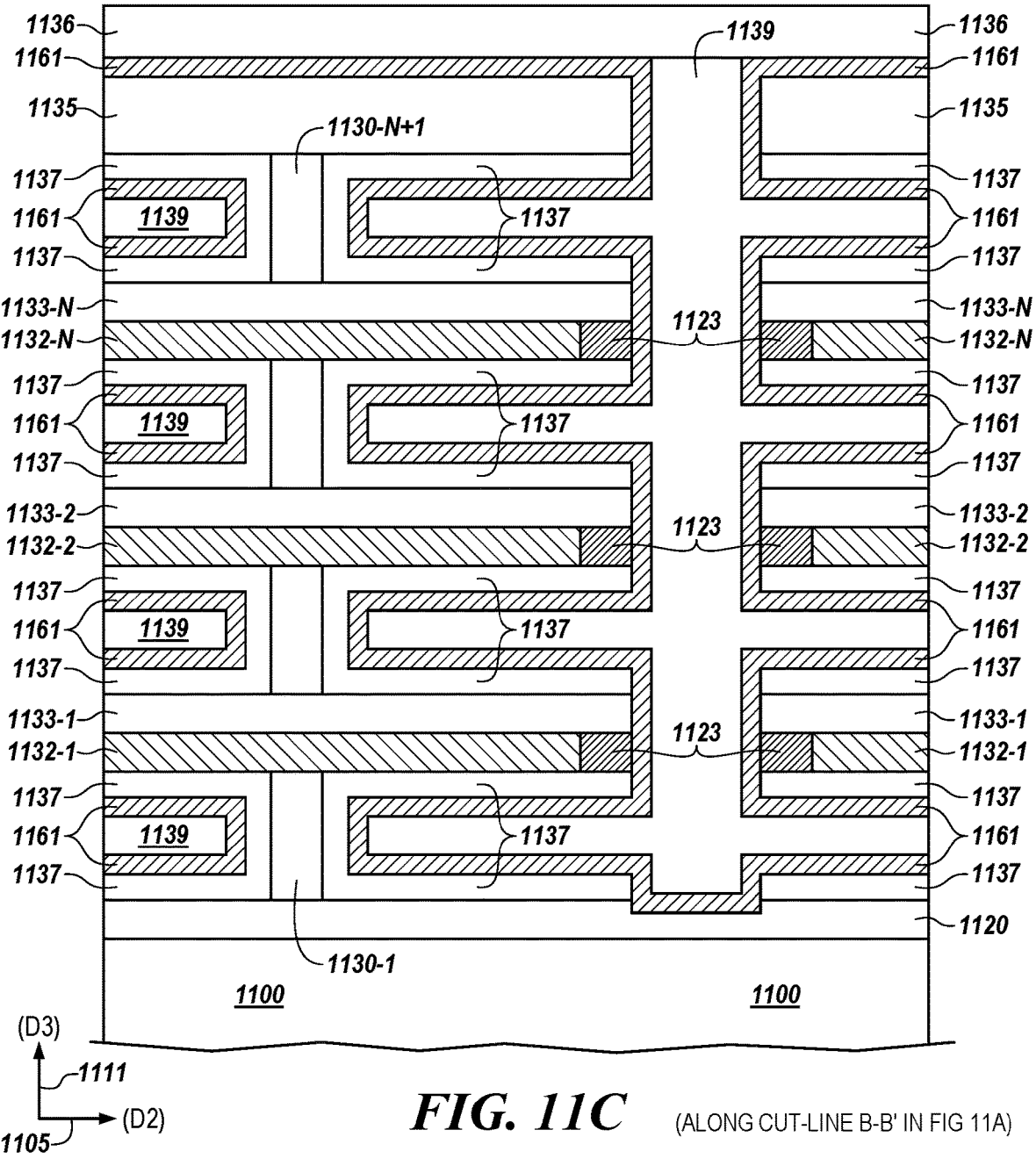
*FIG. 11C*    (ALONG CUT-LINE B-B' IN FIG 11A)

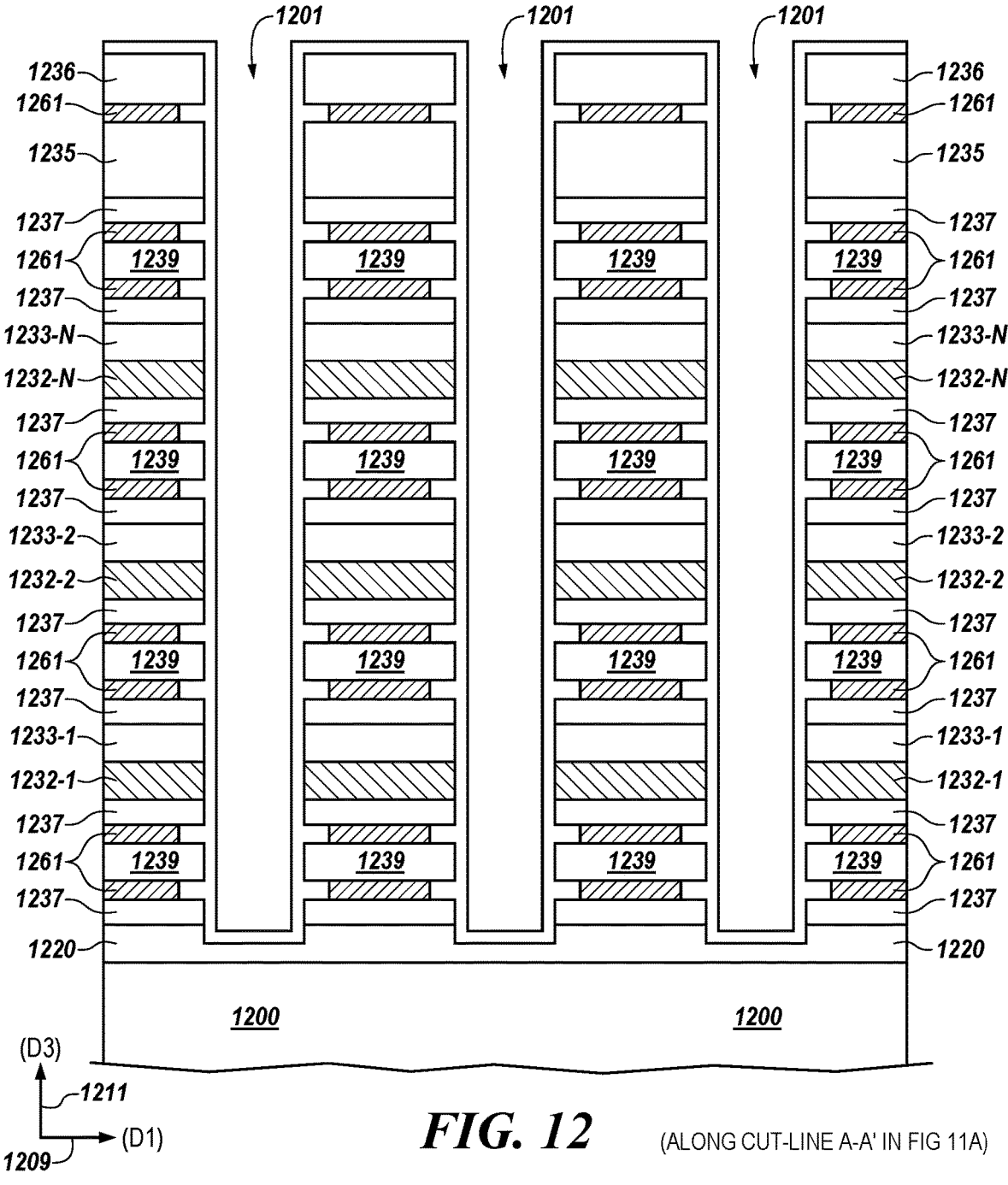
FIG. 12          (ALONG CUT-LINE A-A' IN FIG 11A)

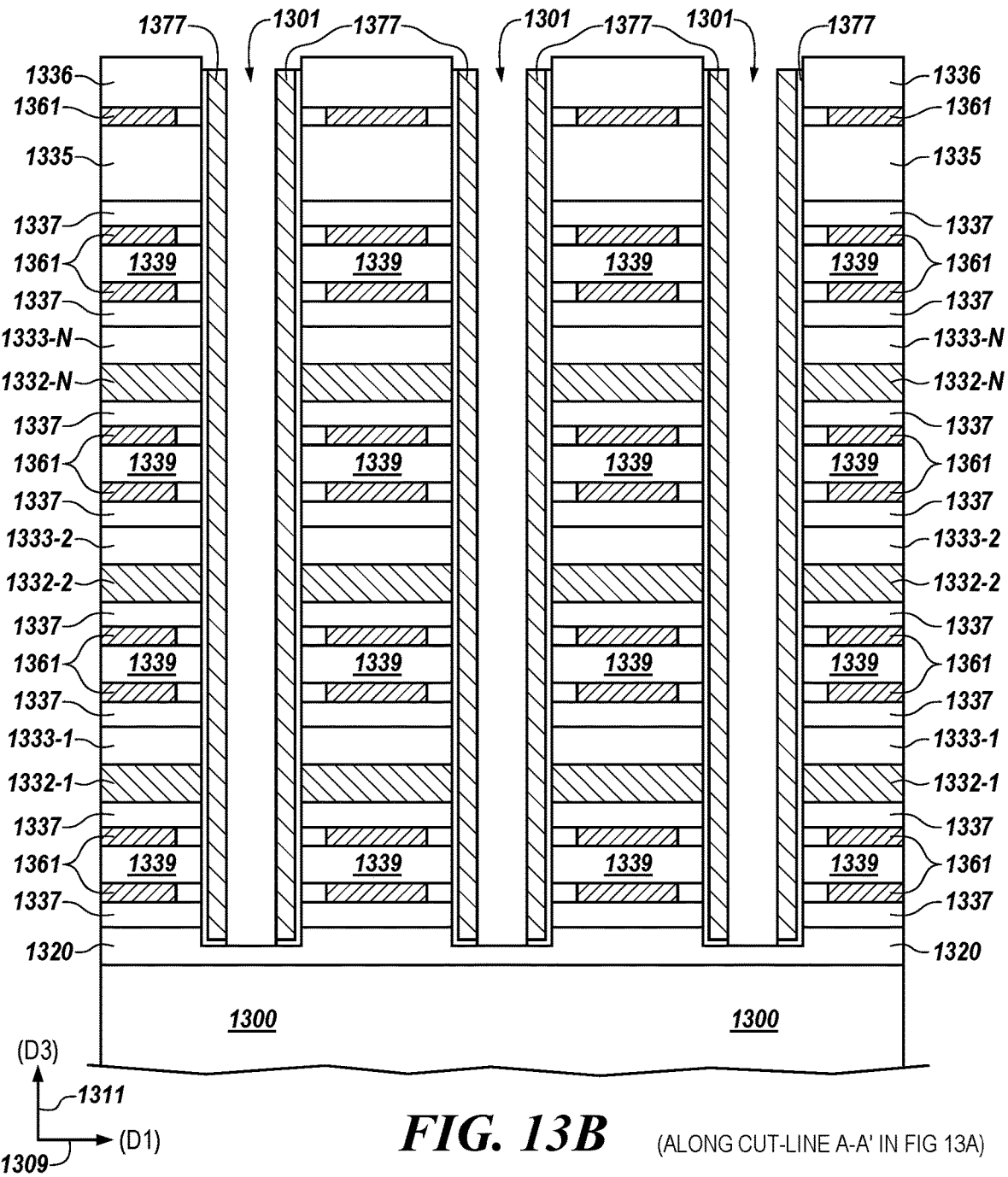
FIG. 13B     (ALONG CUT-LINE A-A' IN FIG 13A)

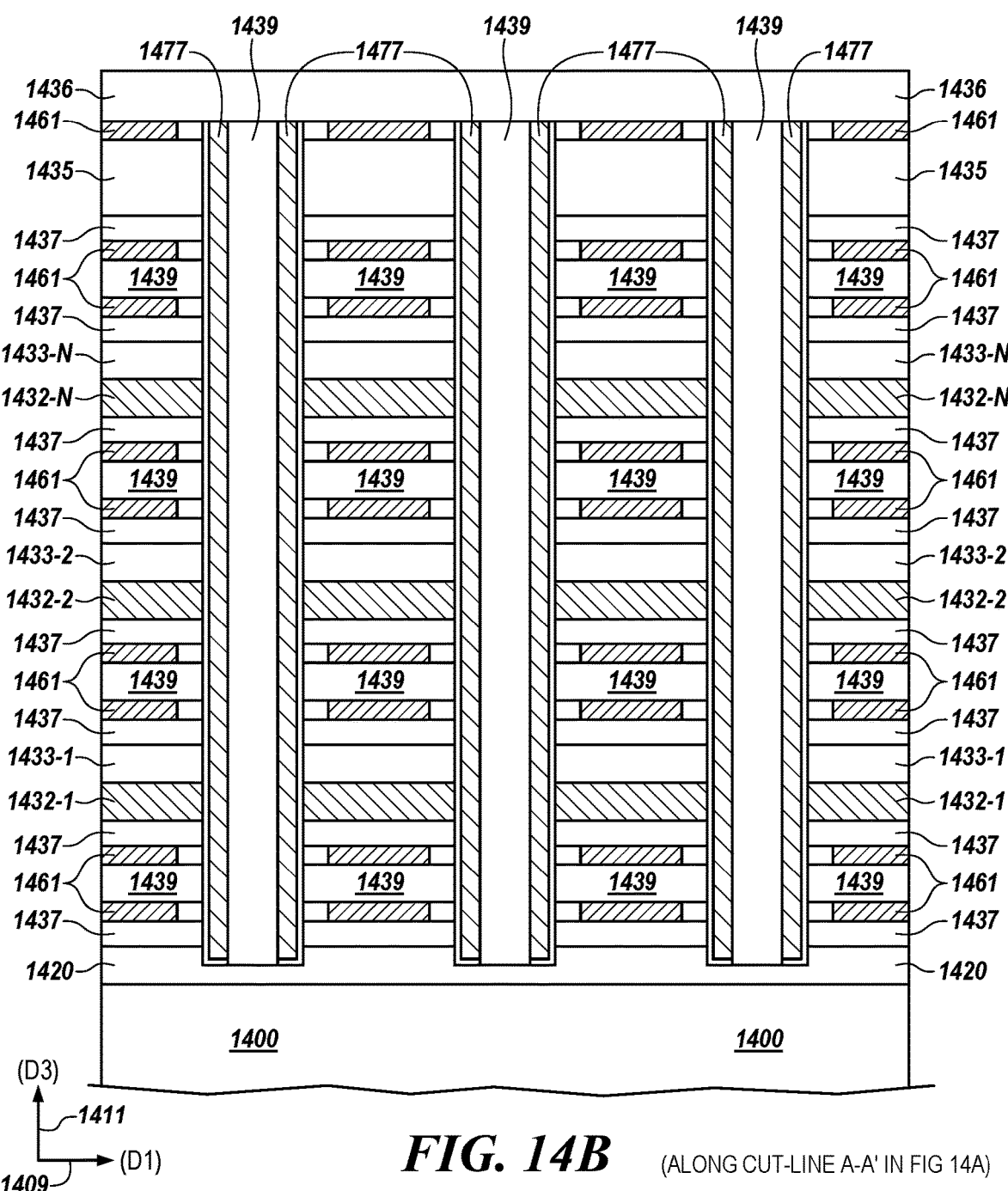
FIG. 14B   (ALONG CUT-LINE A-A' IN FIG 14A)

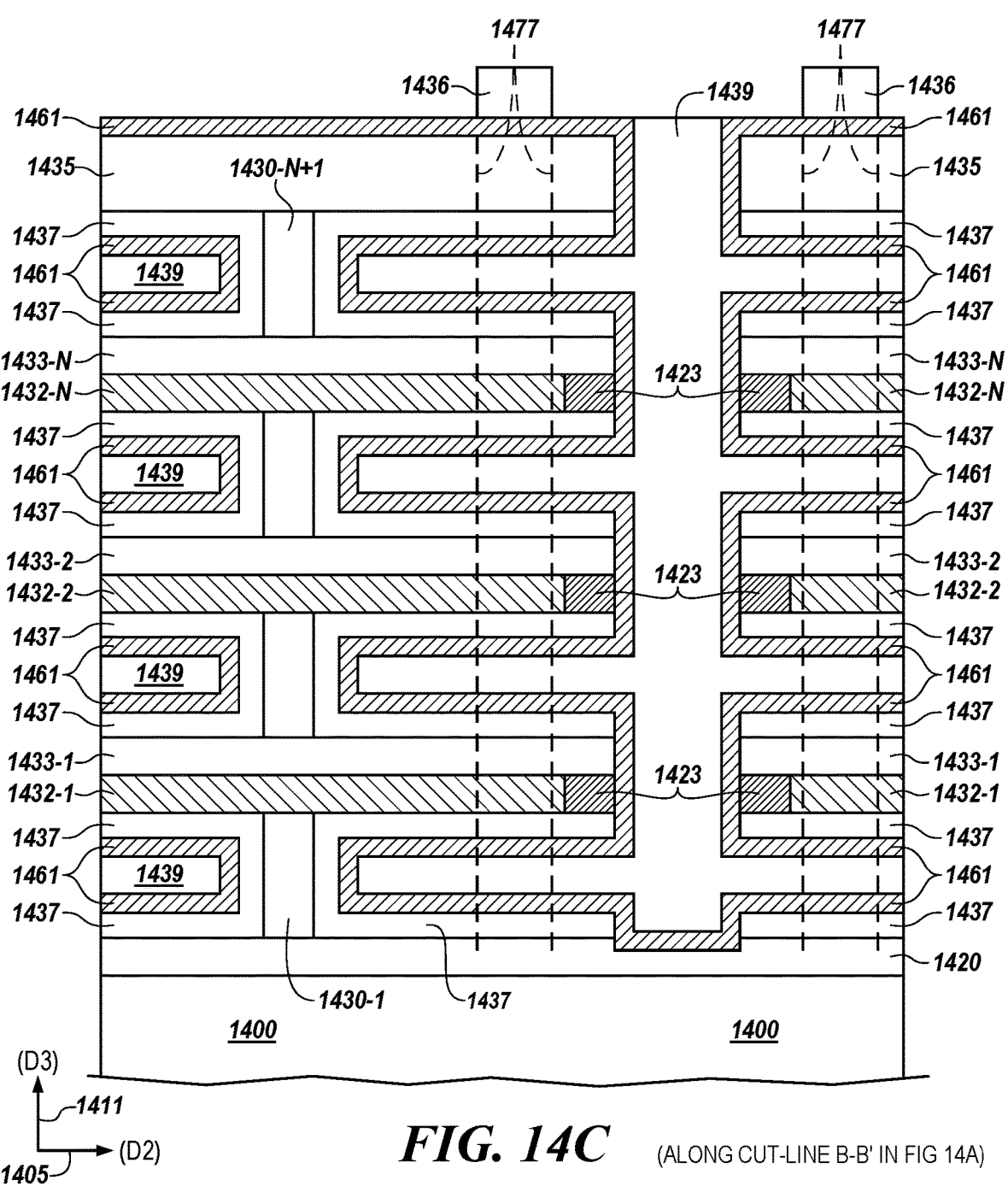
FIG. 14C    (ALONG CUT-LINE B-B' IN FIG 14A)

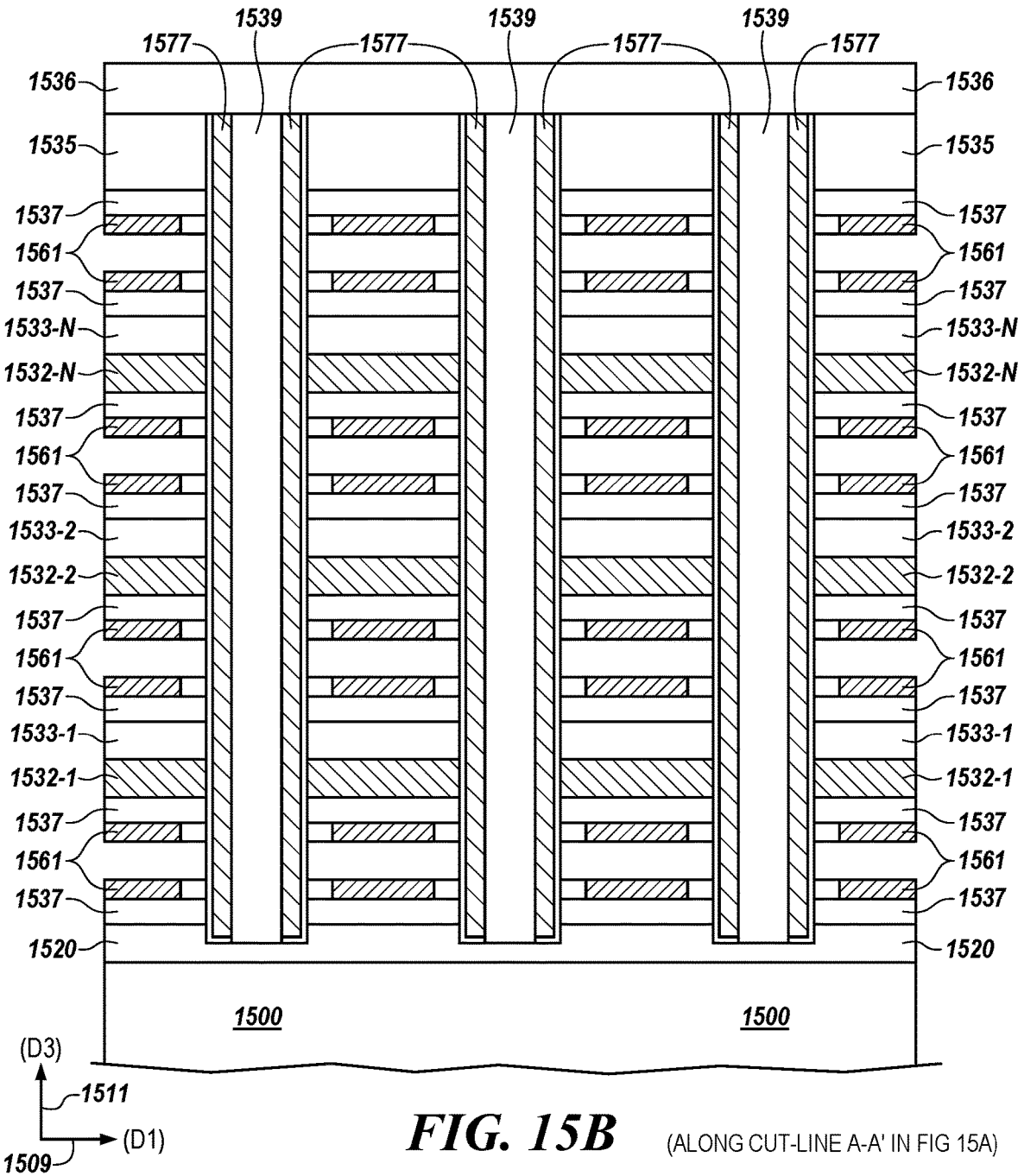
FIG. 15B    (ALONG CUT-LINE A-A' IN FIG 15A)

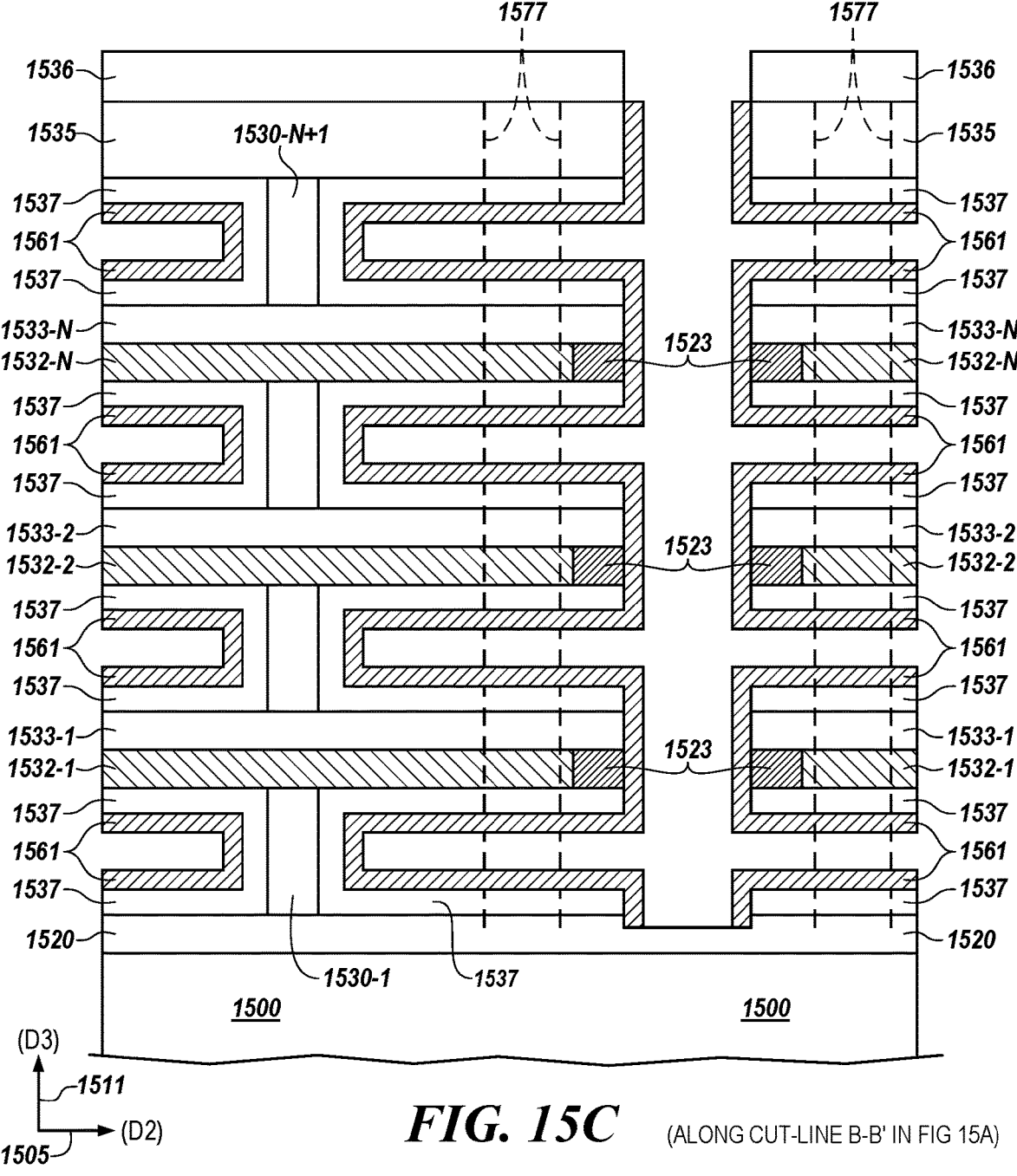
FIG. 15C    (ALONG CUT-LINE B-B' IN FIG 15A)

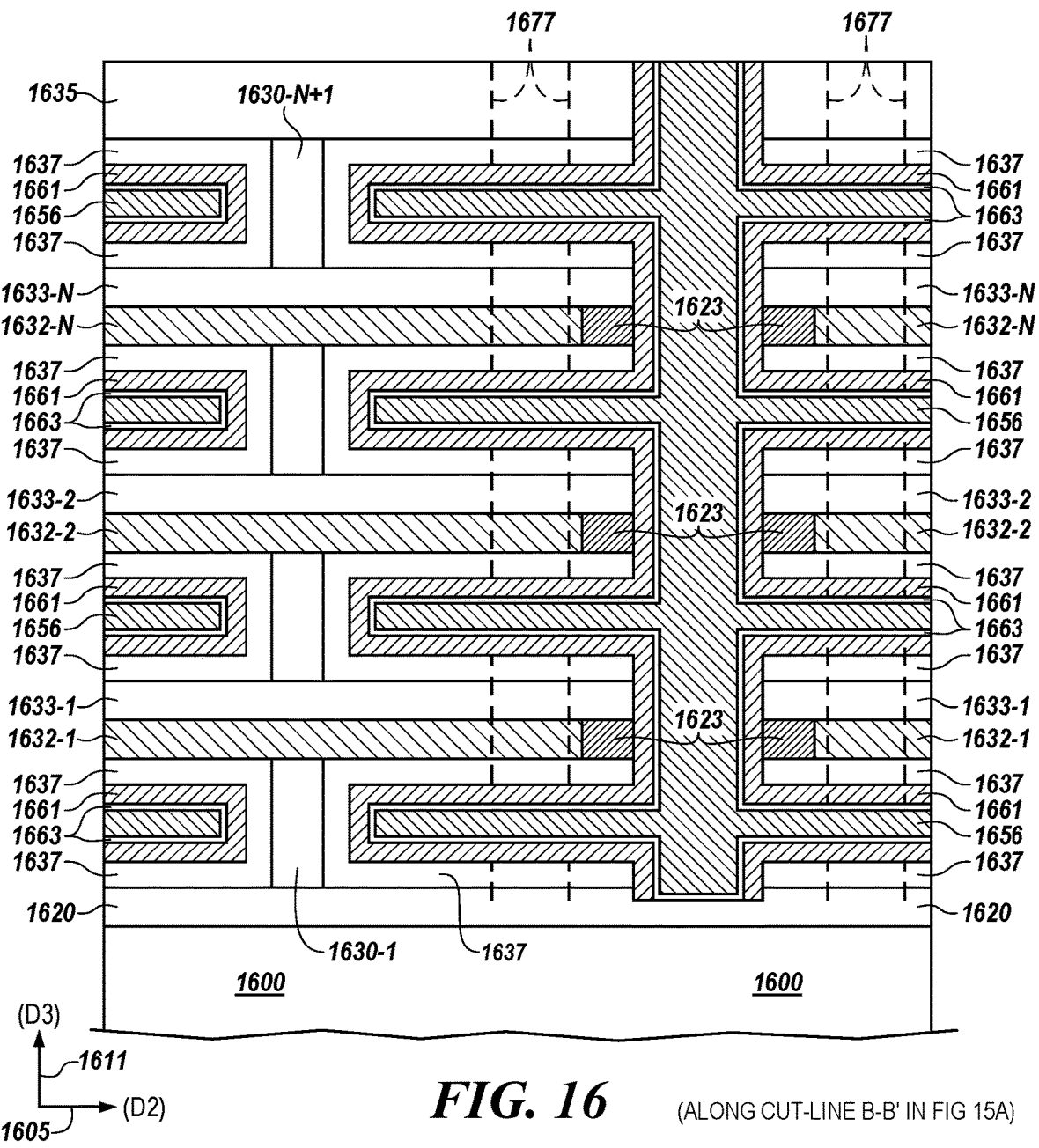
FIG. 16  (ALONG CUT-LINE B-B' IN FIG 15A)

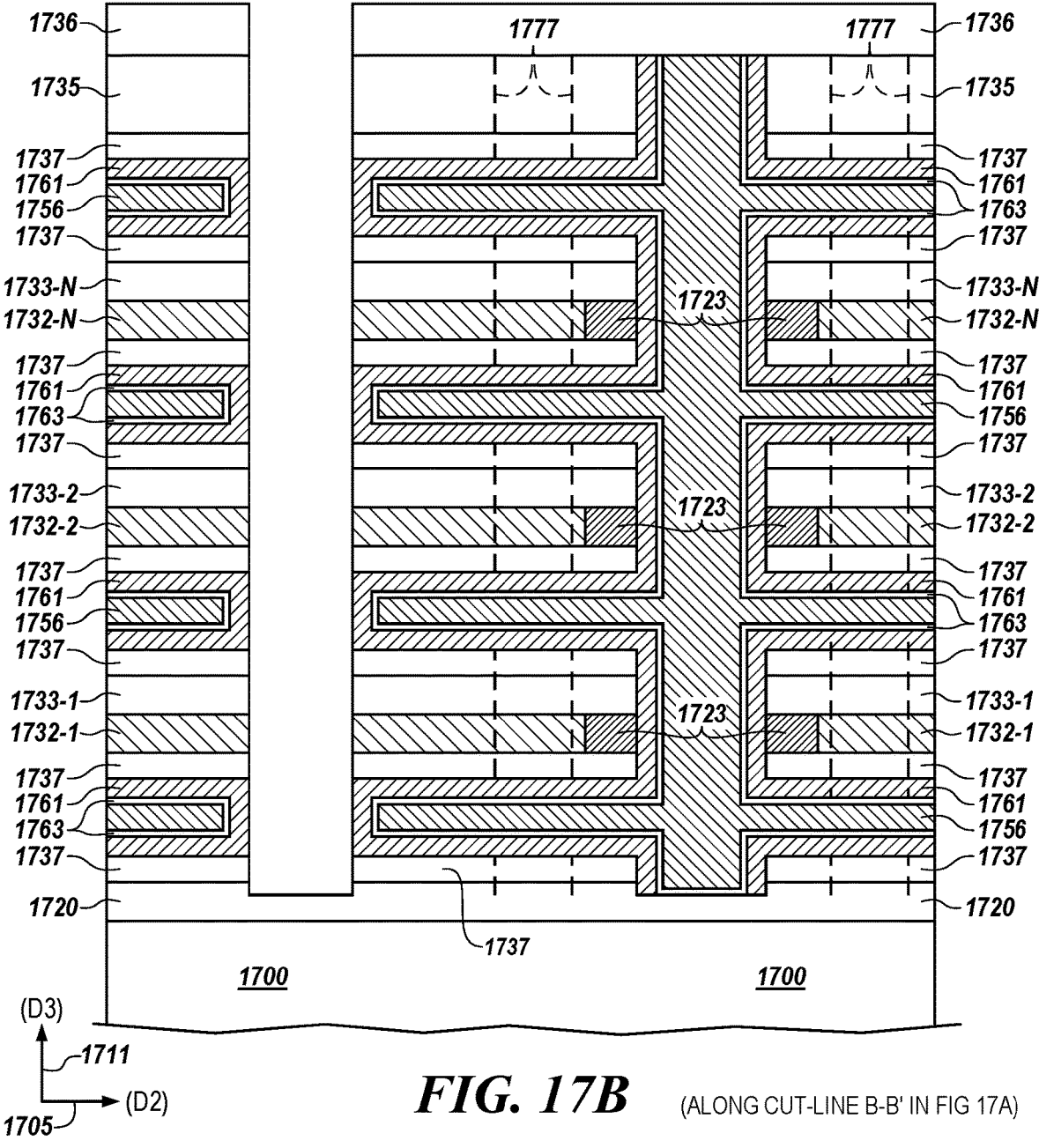
FIG. 17B (ALONG CUT-LINE B-B' IN FIG 17A)

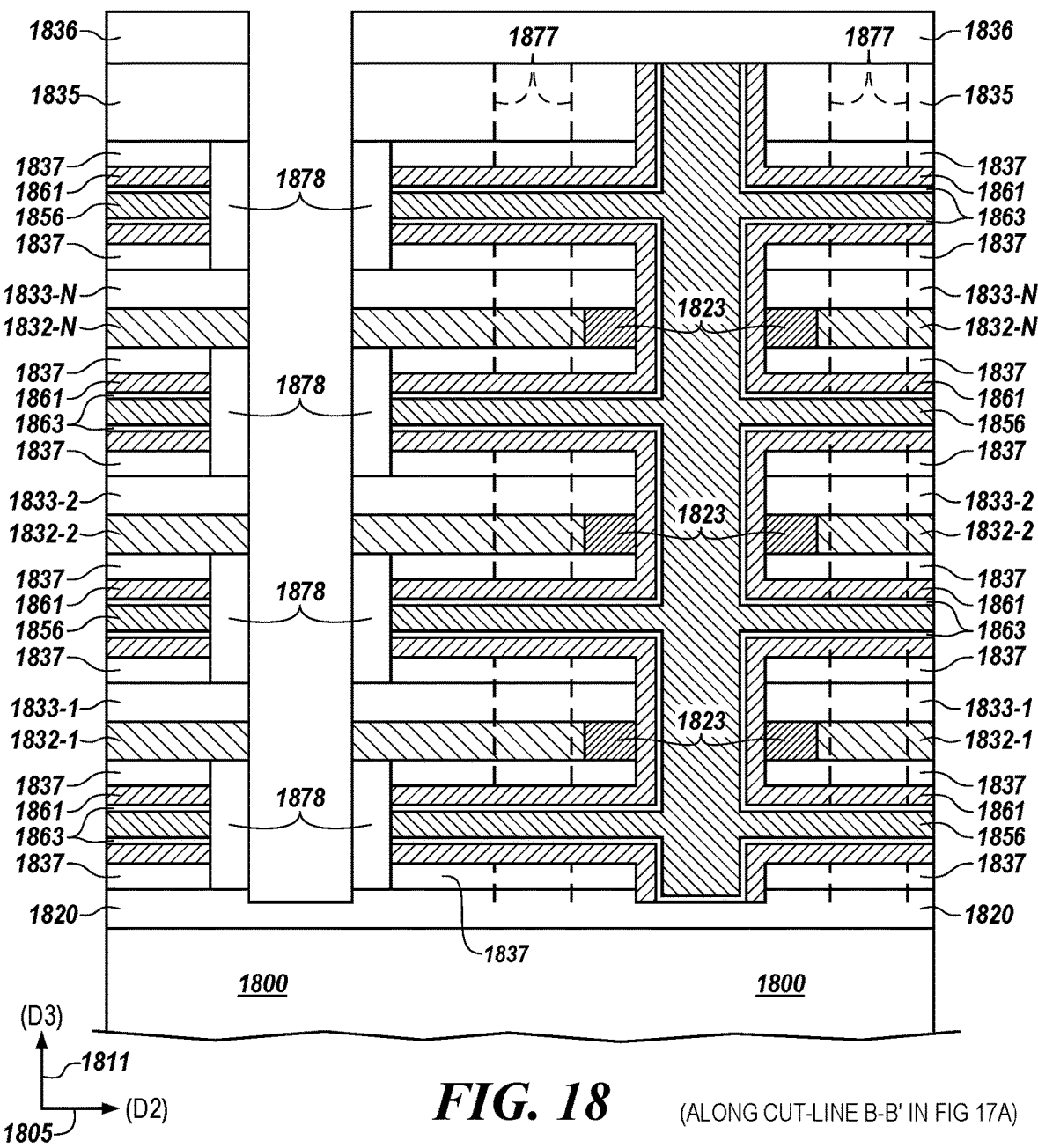
FIG. 18      (ALONG CUT-LINE B-B' IN FIG 17A)

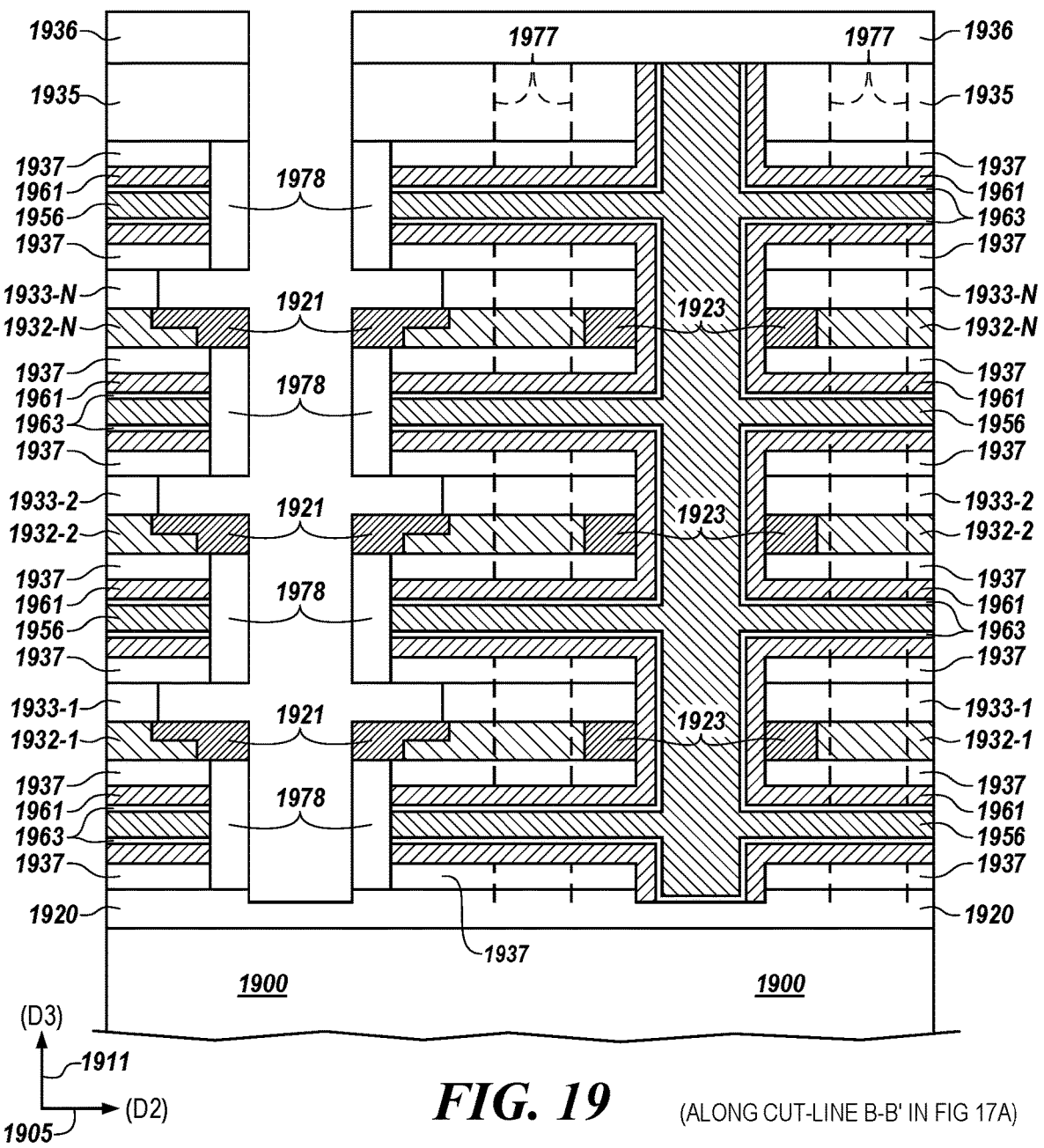
*FIG. 19*    (ALONG CUT-LINE B-B' IN FIG 17A)

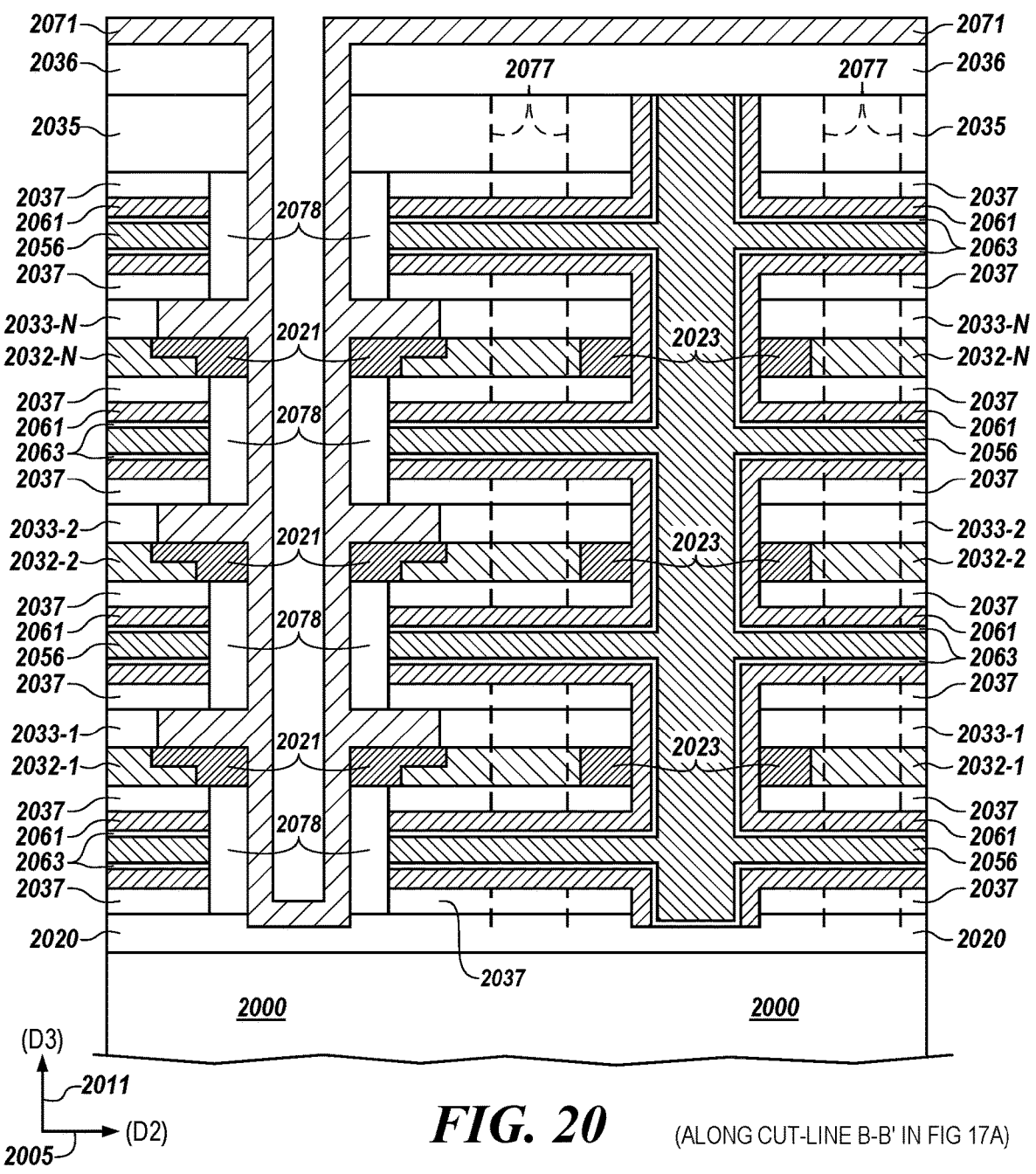
FIG. 20     (ALONG CUT-LINE B-B' IN FIG 17A)

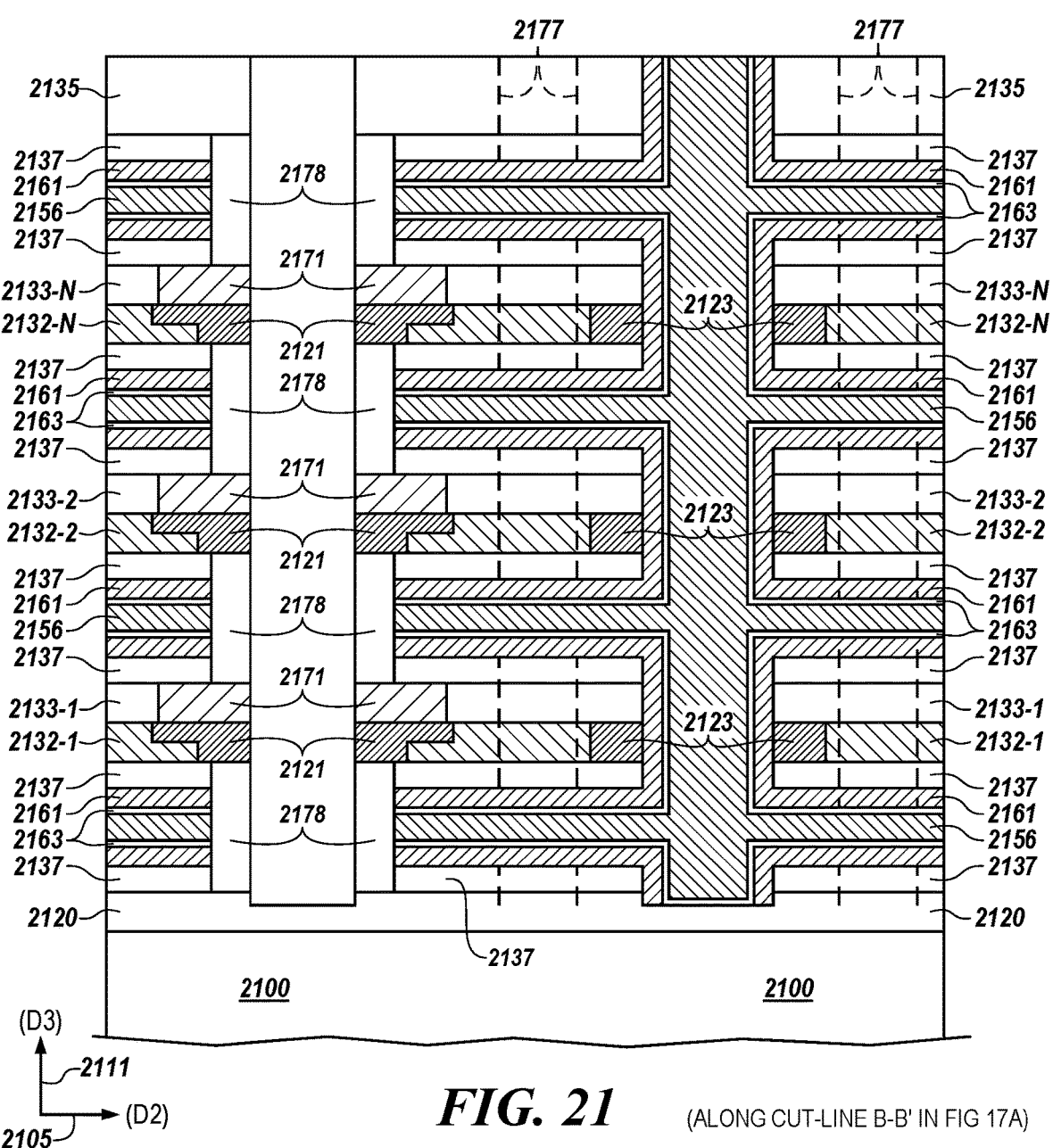
FIG. 21        (ALONG CUT-LINE B-B' IN FIG 17A)

VERTICALLY STACKED STORAGE NODES AND ACCESS DEVICES WITH VERTICAL ACCESS LINES

TECHNICAL FIELD

The present disclosure relates generally to memory devices, and more particularly, to a three-dimensional memory having vertically stacked storage nodes and access devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory, e.g., phase-change random access memory, resistive memory, e.g., resistive random-access memory, cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the access device. A DRAM cell can include a storage node, such as a capacitor cell, coupled by the access device to a digit line. The access device can be enabled, e.g., to select the cell, by activating the access line to which its gate is coupled. The storage node can store a charge corresponding to a data value of a respective cell, e.g., a logic "1" or "0".

BRIEF DESCRIPTION OF THE DRAWINGS

FIGS. 5A-5C illustrate several views of a semiconductor structure at a particular time in the fabrication process in accordance with a number of embodiments of the present disclosure.

FIGS. 6A-6C illustrate several views of a semiconductor structure at a particular time in the fabrication process in accordance with a number of embodiments of the present disclosure.

FIGS. 7A-7B illustrate several views of a semiconductor structure at a particular time in a fabrication process in accordance with a number of embodiments of the present disclosure.

FIG. 8 illustrate a view of a semiconductor structure at a particular time in a fabrication process in accordance with a number of embodiments of the present disclosure.

FIGS. 9A-9B illustrate several views of a semiconductor structure at a particular time in a fabrication process in accordance with a number of embodiments of the present disclosure.

FIG. 10 illustrates a view of a semiconductor structure at a particular time in a fabrication process in accordance with a number of embodiments of the present disclosure.

FIGS. 11A-11C illustrate several views of a semiconductor structure at a particular time in the fabrication process in accordance with a number of embodiments of the present disclosure.

FIG. 12 illustrates a view of a semiconductor structure at a particular time in the fabrication process in accordance with a number of embodiments of the present disclosure.

FIGS. 13A-13B illustrate several views of a semiconductor structure at a particular time in the fabrication process in accordance with a number of embodiments of the present disclosure.

FIGS. 14A-14C illustrate several views of a semiconductor structure at a particular time in the fabrication process in accordance with a number of embodiments of the present disclosure.

FIGS. 15A-15C illustrate several views of a semiconductor structure at a particular time in the fabrication process in accordance with a number of embodiments of the present disclosure.

FIG. 16 illustrate several views of a semiconductor structure at a particular time in the fabrication process in accordance with a number of embodiments of the present disclosure.

FIGS. 17A-17B illustrates a view of a semiconductor structure at a particular time in the fabrication process in accordance with a number of embodiments of the present disclosure.

FIG. 18 illustrate several views of a semiconductor structure at a particular time in the fabrication process in accordance with a number of embodiments of the present disclosure.

FIG. 19 illustrates a view of a semiconductor structure at a particular time in the fabrication process in accordance with a number of embodiments of the present disclosure.

FIG. 20 illustrates a view of a semiconductor structure at a particular time in the fabrication process in accordance with a number of embodiments of the present disclosure.

FIG. 21 is a block diagram of an apparatus in accordance with a number of embodiments of the present disclosure.

DETAILED DESCRIPTION

Figure 1:
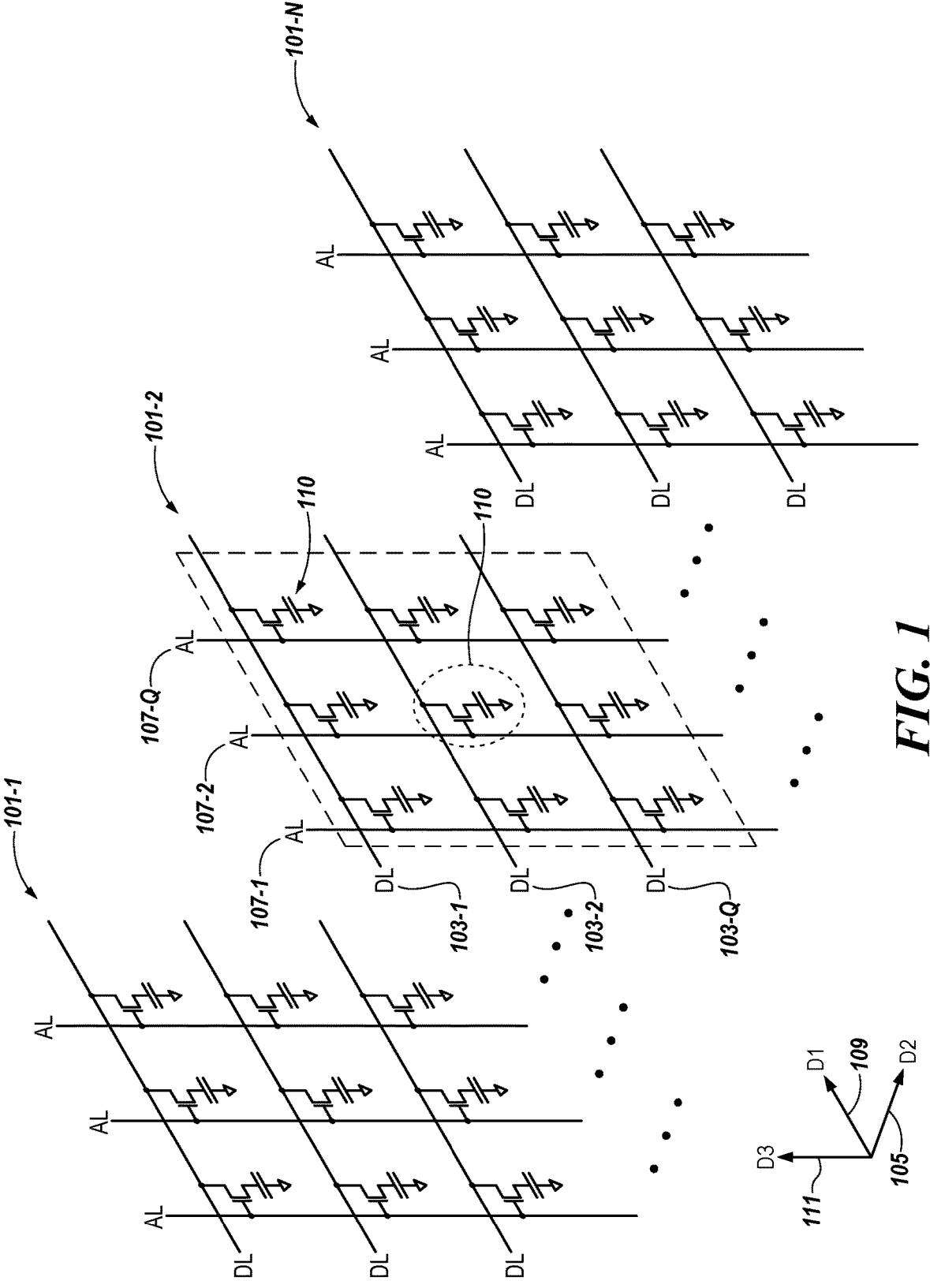
FIG. 1 is a diagram of an apparatus in accordance with a number of embodiments of the present disclosure.

Embodiments of the present disclosure describe a vertically stacked, three-dimensional memory having horizontally oriented access devices and horizontally oriented storage nodes, wherein the horizontally oriented storage nodes are vertically stacked with the horizontally oriented access devices to provide an array of vertically stacked memory cells. The horizontally oriented storage nodes are fabricated vertically between the horizontally oriented access devices to reduce a lateral footprint of each memory cell, access device and storage node, in the vertical array. The horizontally oriented access devices include a first source/drain region and a second source/drain region separated by a channel region. Gates oppose the channel regions, separated therefrom by gate dielectrics. Vertically oriented access lines couple to the gates and horizontally oriented digit lines are coupled to respective first source/drain regions.

Embodiments of the present disclosure provide that the horizontally oriented storage nodes each have a first electrode coupled to the second source/drain regions of the access devices and each first electrode opposes two different sides of the horizontal access devices including an electrical contact with a vertical side of the second source/drain regions. The greater area of the first electrode can provide improved charge storage. And, the vertical alignment of the horizontal access device with the storage node can provide a reduced lateral footprint for memory array density. Embodiments, may also advantageously provide an improved, i.e. reduced, contact resistance. Desirably, this improved contact resistance may provide that different materials, e.g., materials hav+ing a lower mobility, may be utilized, among other benefits.

In some embodiments the gates of the vertically oriented access devices comprise gates formed vertically, opposing each side of the channel regions, to form gate on two side (G2S) structures. Embodiments, however, are not limited to this example.

In some embodiments the first electrodes are opposing three different sides, including a top horizontally oriented side, a bottom horizontally oriented side, and a left and/or right vertically oriented side, of each horizontally oriented access device. In some embodiments the top horizontally oriented side and the bottom horizontally oriented side of each first electrode extends substantially an entire length of the horizontally oriented access devices.

The figures herein follow a numbering convention in which the first digit or digits correspond to the figure number of the drawing and the remaining digits identify an element or component in the drawing. Similar elements or components between different figures may be identified by the use of similar digits. For example, reference numeral 111 may reference element "11" in FIG. 1, and a similar element may be referenced as 211 in FIG. 2. Multiple analogous elements within one figure may be referenced with a reference numeral followed by a hyphen and another numeral or a letter. For example, 103-1 may reference element 103-1 in FIGS. 1 and 103-2 may reference element 103-2, which may be analogous to element 103-1. Such analogous elements may be generally referenced without the hyphen and extra numeral or letter. For example, elements 103-1 and 103-2 or other analogous elements may be generally referenced as 103. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

FIG. 1 is a diagram of an apparatus in accordance with a number of embodiments of the present disclosure. FIG. 1 illustrates a circuit diagram showing a cell array of a three dimensional (3D) semiconductor memory device according to embodiments of the present disclosure. FIG. 1 illustrates that a cell array may have a plurality of sub cell arrays 101-1, 101-2, . . . 101-N. The sub cell arrays 101-1, 101-2, . . . 101-N may be arranged along a second direction (D2) 105. Each of the sub cell arrays, e.g., sub cell array 101-2, may include a plurality of access lines 107-1, 107-2, . . . 107-Q (which also may be referred to a word lines). Also, each of the sub cell arrays, e.g., sub cell array 101-2, may include a plurality of digit lines 103-1, 103-2, . . . 103-Q (which also may be referred to as bit lines, data lines, or sense lines). In FIG. 1, the access lines 107-1, 107-2, . . . 107-Q are illustrated extending in a third direction (D3) 111 and the digit lines 103-1, 103-2, . . . , 103-Q are illustrated extending in a first direction (D1) 109. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the digit lines 103-1, 103-2, . . . 103-Q are extending in a horizontal direction, e.g., first direction (D1) 109.

A memory cell, e.g., 110, may include an access device, e.g., access transistor, and a storage node located at an intersection of each access line 107-1, 107-2, . . . 107-Q and each digit line 103-1, 103-2, . . . 103-Q. Memory cells may be written to, or read from, using the access lines 107-1, 107-2, . . . 107-Q and digit lines 103-1, 103-2, . . . 103-Q. The access lines 107-1, 107-2, . . . 107-Q may conductively interconnect memory cells along vertical columns of each sub cell array 101-, 101-2, . . . 101-N, and the digit lines 103-1, 103-2, . . . 103-Q may conductively interconnect memory cells along horizontal rows of each sub cell array 101-, 101-2, . . . 101-N. One memory cell, e.g. 110, may be located between one access line, e.g., 107-2, and one digit line, e.g., 103-2. Each memory cell may be uniquely addressed through a combination of an access line 107-1, 107-2, . . . 107-Q and a digit line 103-1, 103-2, . . . 103-Q.

The access lines 107-1, 107-2, . . . 107-Q may be or include conducting patterns, e.g., metal lines, disposed on and spaced apart from a substrate. The access lines 107-1, 107-2, . . . 107-Q may extend in a third direction (D3) 111. The access lines 107-1, 107-2, . . . 107-Q in one sub cell array, e.g., 101-2, may be spaced apart from each other in a horizontal direction, e.g., in a first direction (D1) 109.

The digit lines 103-1, 103-2, . . . 103-Q may be or include conductive patterns, e.g., metal lines, extending in a horizontal direction with respect to the substrate, e.g., in a first direction (D1) 109. The digit lines in one sub cell array, e.g., 101-2, may be spaced apart from each other in the third direction (D3) 111.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 2:
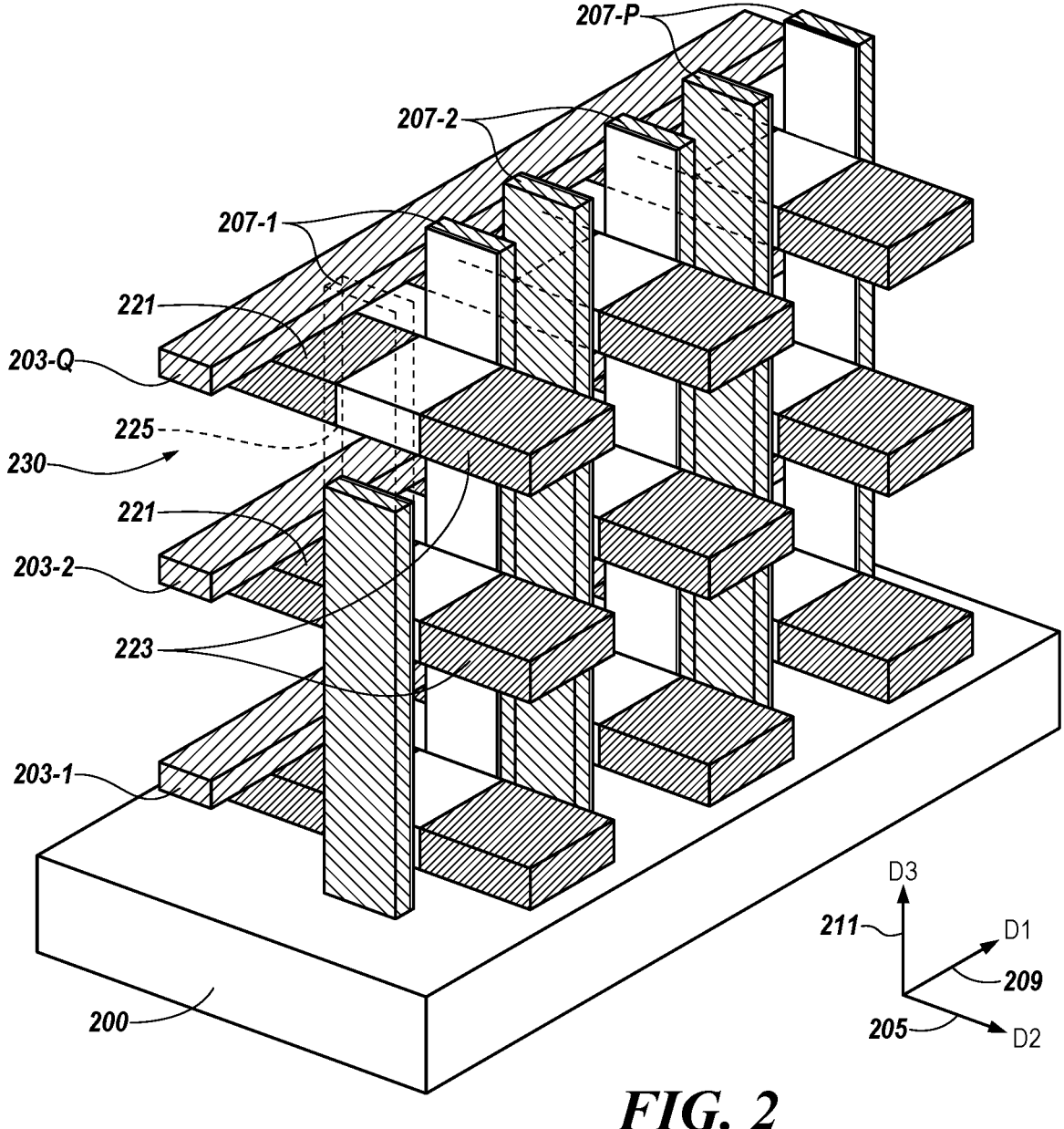
FIG. 2 is a perspective view illustrating a portion a three dimensional (3D) semiconductor memory device in accordance with a number of embodiments of the present disclosure.

FIG. 2 illustrates a perspective view showing a three dimensional (3D) semiconductor memory device, e.g., a portion of a sub cell array 201-2 shown in FIG. 1 as a vertically oriented stack of memory cells in an array, according to some embodiments of the present disclosure.

As shown in FIG. 2, a substrate 200 may have formed thereon a number of sub cell arrays, e.g., 201-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 210 in FIG. 1, extending in a vertical direction, e.g., third direction (D3) 211. According to some embodiments the vertically oriented stack of memory cells may be fabricated such that each memory cell, e.g., memory cell 110 in FIG. 1, is formed on plurality of vertical tiers, e.g., a first level 213-1 (L1), a second level 213-2 (L2), and a third level 213-P (L3). While three tiers are illustrated in FIG. 2 embodiments are not so limited, for instance, more than three or fewer than three vertical tiers may be utilized. The repeating, vertical tiers, L1, L2, and L3, may be arranged, e.g., "stacked", a vertical direction, e.g., third direction (D3) 211 shown in FIG. 2, and may be separated from the substrate 200 by an insulator material 220. Each of the repeating, vertical tiers, e.g., levels, L1, L2, and L3, may include a plurality of discrete components, e.g., regions, to the horizontally oriented access devices 230, e.g., transistors, and storage nodes, including access line 203-1, 203-2, . . . 203-Q connections and digit line 207-1, 207-2, . . . 207-Q connections. The plurality of discrete components to the horizontally oriented access devices 230, may be formed in a plurality of iterations of vertically, repeating layers within each tier.

The horizontally oriented access devices 230 may include a first source/drain region 221 and a second source/drain region 223 separated by a channel region 225, extending laterally in the second direction (D2) 205, and may be formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

Figure 3A:
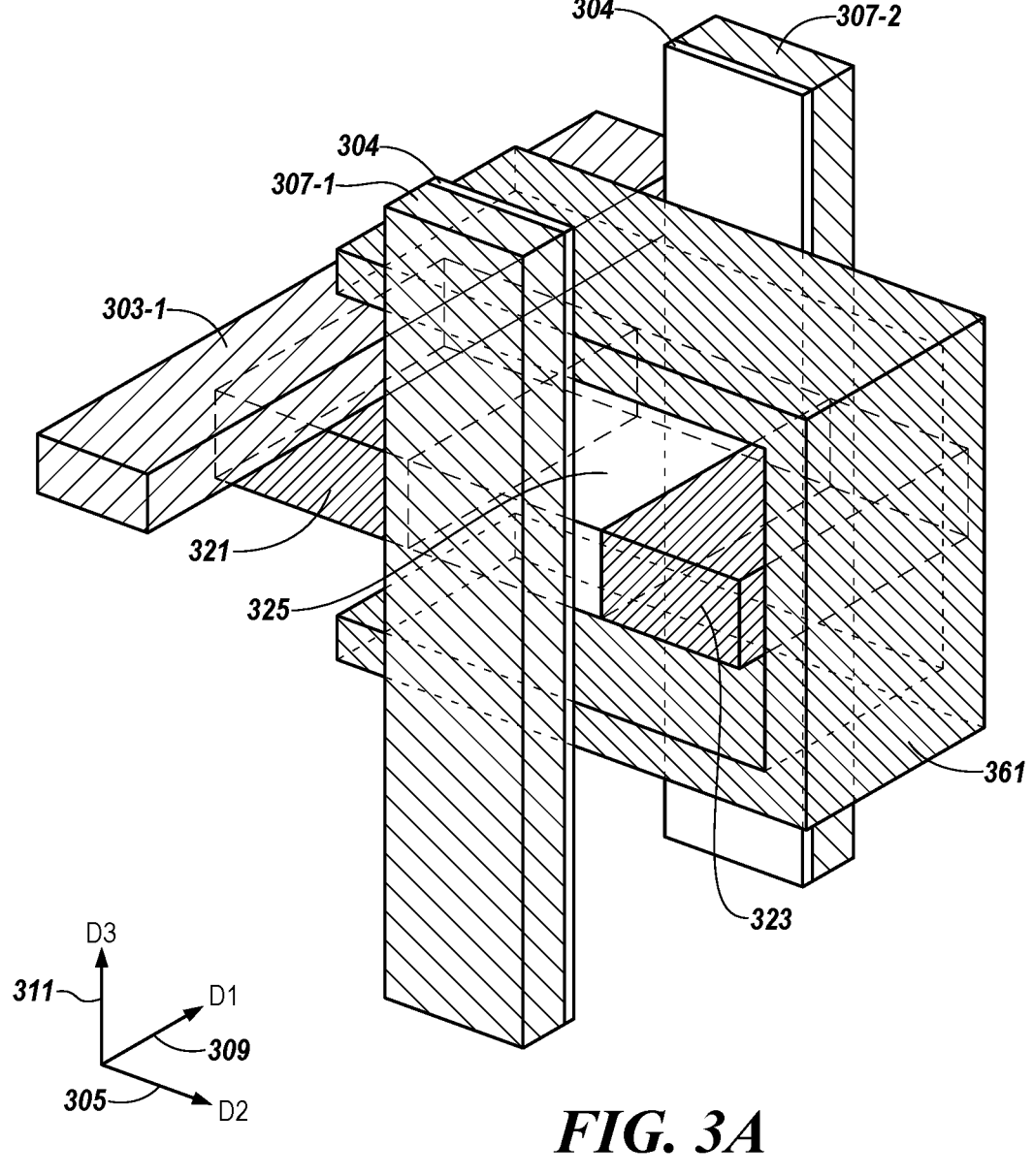
FIG. 3A is a perspective view illustrating a portion of a three-node access device in a vertical three dimensional (3D) memory cell in accordance with a number of embodiments of the present disclosure.
Figure 3B:
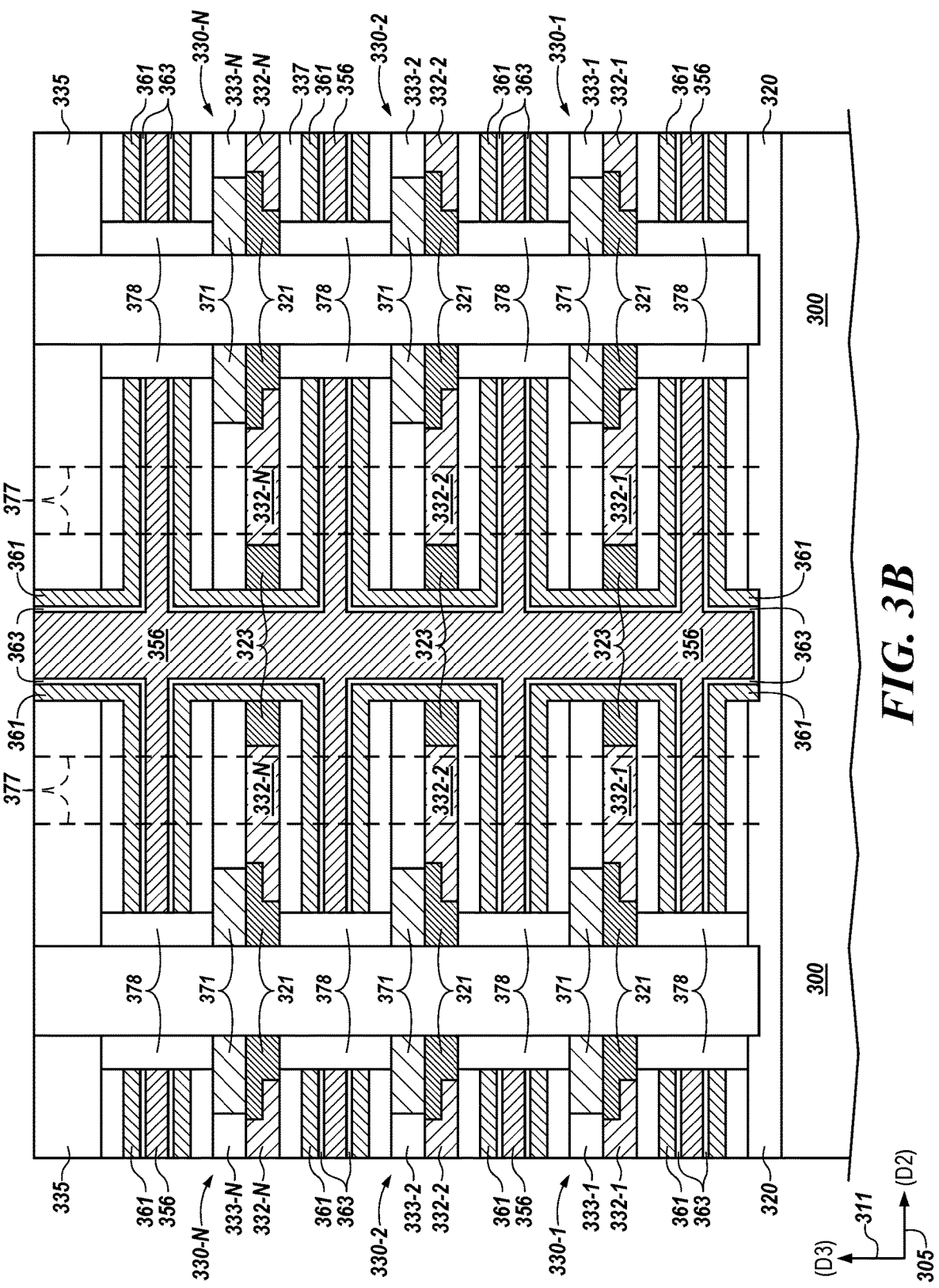
FIG. 3B illustrates a cross sectional view of vertically stacked storage nodes and access device with horizontal access lines in a 3D vertical memory architecture in accordance with a number of embodiments of the present disclosure.

The storage node 227, e.g., capacitor, may be connected to one respective end of the access device. As will be described further herein, the storage node 227 includes a first electrode which, as shown in FIGS. 3A and 3B, may be connected to a vertical surface of the second source/drain region 223 of the access device. As discussed further in connection with FIGS. 3A and 3B, the horizontally oriented storage nodes are vertically separated from the horizontally oriented access devices. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented digit lines 203-1, 203-2, . . . 203-Q extend in the first direction (D1) 209, analogous to the first direction (D1) 109 in FIG. 1. The plurality of horizontally oriented digit lines 203-1, 203-2, . . . 203-Q may be arranged, e.g., "stacked", along the third direction (D3) 211. The plurality of horizontally oriented digit lines 203-1, 203-2, . . . 203-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples. In some embodiments, the plurality of horizontally oriented digit lines 203-1, 203-2, . . . 203-Q, extending in the first direction (D1) 209, may be connected to top surfaces of the first source/drain regions 221 directly and/or through additional contacts including metal silicides.

Among each of the vertical tiers, (L1) 213-1, (L2) 213-2, and (L3) 213-P, the horizontally oriented memory cells, e.g., memory cell 110 in FIG. 1, may be spaced apart from one another horizontally in the first direction (D1) 209. However, the plurality of discrete components to the horizontally oriented access devices 230, e.g., first source/drain region 221 and second source/drain region 223 separated by a channel region 225, extending laterally in the second direction (D2) 205, and the plurality of horizontally oriented digit lines 203-1, 203-2, . . . 203-Q extending laterally in the first direction (D1) 209, may be formed within different vertical layers within each tier. For example, the plurality of horizontally oriented digit lines 203-1, 203-2, . . . 203-Q, extending in the first direction (D1) 209, may be formed on a top surface opposing and electrically coupled to the channel regions 225, separated therefrom by a gate dielectric, and orthogonal to horizontally oriented access devices 230, e.g., transistors, extending in laterally in the second direction (D2) 205. In some embodiments, the plurality of horizontally oriented digit lines 203-1, 203-2, . . . 203-Q, extending in the first direction (D1) 209 are formed in a higher vertical layer, farther from the substrate 200, within a tier, e.g., within level (L1), than a layer in which the discrete components, e.g., first source/drain region 221 and second source/drain region 223 separated by a channel region 225, of the horizontally oriented access device are formed.

As shown in the example embodiment of FIG. 2, the access lines, 207-1, 207-2, . . . 207-Q, extend in a vertical direction with respect to the substrate 200, e.g., in a third direction (D3) 211. Further, as shown in FIG. 2, the access lines, 207-1, 207-2, . . . 207-Q, in one sub cell array, e.g., sub cell array 201-2 in FIG. 1, may be spaced apart from each other in the first direction (D1) 209. The access lines, 207-1, 207-2, . . . 207-Q, may be provided, extending vertically relative to the substrate 200 in the third direction (D3) 211 in vertical alignment with channel regions to serve as gates for each of the horizontally oriented access devices 230 extending laterally in the second direction (D2) 205, but adjacent channel to gate on a tier, e.g., first level (L1), in the first direction (D1) 209. Each of the access lines, 207-1, 207-2, . . . 207-Q, may vertically extend, in the third direction (D3), on sidewalls, adjacent channel regions 225, of respective ones of the plurality of horizontally oriented access devices 230 that are vertically stacked. In some embodiments, the plurality of vertically oriented access lines 207-1, 207-2, . . . 207-Q, extending in the third direction (D3) 211, may be connected to adjacent side surfaces of the channel regions 225, separated therefrom by gate dielectrics.

A first one of the vertically extending access lines, e.g., 207-1, may be adjacent a sidewall of a channel region 225 to a first one of the horizontally oriented access devices 230 in the first tier (L1) 213-1, a sidewall of a channel region 225 of a first one of the horizontally oriented access devices 230 in the second tier (L2) 213-2, and a sidewall of a channel region 225 a first one of the horizontally oriented access devices 230 in the third tier (L3) 213-P, etc. Similarly, a second one of the vertically extending access lines, e.g., 207-2, may be adjacent a sidewall to a channel region 225 of a second one of the horizontally oriented access devices 230 in the first tier (L1) 213-1, spaced apart from the first one of horizontally oriented access devices 230 in the first tier (L1) 213-1 in the first direction (D1) 209. And the second one of the vertically extending access lines, e.g., 207-2, may be adjacent a sidewall of a channel region 225 of a second one of the laterally oriented access devices 230 in the second tier (L2) 213-2, and a sidewall of a channel region 225 of a second one of the horizontally oriented access devices 230 in the third tier (L3) 213-P, etc. Embodiments are not limited to a particular number of tiers. The vertically extending access lines, 207-1, 207-2, . . . , 207-Q, may include a conductive material, such as, for example, one of a doped semiconductor material, a conductive metal nitride, metal, and/or a metal-semiconductor compound. Embodiments, however, are not limited to these examples.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3A is a perspective view illustrating a portion of a three-node access device in a vertical three dimensional (3D) memory cell in accordance with a number of embodiments of the present disclosure. As mentioned, embodiments provide that the access devices 330 include a first source/drain region 321, a channel region 325, and a second source/drain region 323.

As shown in the example embodiment of FIG. 3A, each of the first source/drain region 321, the channel region 325, and the second source/drain region 323 may be represented as cuboids, e.g., rectangular prisms. The first source/drain region 321 has a horizontal length, the channel region 325 has a horizontal length, and the second source/drain region 323 has a horizontal length. The first source/drain region 321, the channel region 325, and the second source/drain region 323 each have a vertical height. The first source/drain region 321, the channel region 325, and the second source/drain region 323 each have a horizontal width. As used herein, the horizontal length of the first source/drain region 321, the channel region 325, and the second source/drain region 323 make up a total length (TL) of the access device 330. As shown in the embodiment of FIG. 3A, a first electrode 361, e.g., first electrode of a storage node, opposes at least two different sides of the access device 330. In the example embodiment of FIG. 3A, the first electrode 361 opposes three different sides of the access device 330, including a top horizontally oriented side, a bottom horizontally oriented side, and a left and/or right vertically oriented side, of each horizontally oriented access device 330, including an electrical contact with a vertical side of the second source/drain region 323 of the horizontally oriented access device 330. The top horizontally oriented side is above the access device 330 in the third, vertical direction (D3) 311, and the bottom horizontally oriented side is below the access device 330 in the third, vertical direction (D3) 311. The third opposing side of the first electrode 361 is extends vertically in the third direction (D3) 311 along side, and in electrical contact with the second source/drain region 323.

In some embodiments, the top and/or bottom horizontally oriented sides of the first electrode 361 extend substantially an entire length of the access device 331, e.g., substantially equal in length to the total length (TL) of the access device 330. In at least one embodiment, as used herein, "substantially an entire length" is intended to mean that the top and/or bottom horizontally oriented sides of the first electrode 361 extend a length that is at least 50% of the total length (TL) of the access device 330. In at least one embodiment, as used herein, "substantially an entire length" is intended to mean that the top and/or bottom horizontally oriented sides of the first electrode 361 extend a length that is at least 60% of the total length (TL) of the access device 330. In at least one embodiment, as used herein, "substantially an entire length" is intended to mean that the top and/or bottom horizontally oriented sides of the first electrode 361 extend a length that is at least 70% of the total length (TL) of the access device 330. In at least one embodiment, as used herein, "substantially an entire length" is intended to mean that the top and/or bottom horizontally oriented sides of the first electrode 361 extend a length that is at least 75% of the total length (TL) of the access device 330. In at least one embodiment, as used herein, "substantially an entire length" is intended to mean that the top and/or bottom horizontally oriented sides of the first electrode 361 extend a length that is at least 80% of the total length (TL) of the access device 330. In at least one embodiment, as used herein, "substantially an entire length" is intended to mean that the top and/or bottom horizontally oriented sides of the first electrode 361 extend a length that is at least 85% of the total length (TL) of the access device 330. And, in at least one embodiment, as used herein, "substantially an entire length" is intended to mean that the top and/or bottom horizontally oriented sides of the first electrode 361 extend a length that is at least 90% of the total length (TL) of the access device 330.

As shown in FIG. 3A, the access device 330 is vertically separated from the first electrode 361. The first electrode 361 may form a portion of a storage node and according to embodiments, as shown in FIG. 3B, the storage node is formed vertically, between stacked access devices 330.

A gate 312 of the access device 330 for a memory cell, e.g., memory cell 110 in FIG. 1, may be connected to an access line, e.g., 307, and a first conductive node, e.g., first source/drain region 321, of the access device 330 for the memory cell may be connected to a digit line, e.g., 303-1. Each access device may be connected to a first electrode 361 of a storage node. A second conductive node, e.g., second source/drain region 323, of the access device for a memory cell may be connected to a first electrode 361 of a storage node. Storage nodes, such as capacitors, can be formed from ferroelectric and/or dielectric materials such as zirconium oxide ($ZrO2$), hafnium oxide ($HfO2$) oxide, lanthanum oxide ($La2O3$), lead zirconate titanate (PZT, $Pb[Zr(x)Ti(1-x)]O3$), barium titanate ($BaTiO3$), aluminum oxide (e.g., $Al2O3$), a combination of these with or without dopants, or other suitable materials. As discussed further with FIG. 3B, the access devices are vertically separated from the storage nodes.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 303-1, and the other may be connected to a storage node, e.g., 301 shown in FIG. 3B.

FIG. 3B illustrates a two-dimensional cross section of the vertically stacked memory cells having storage nodes 301 between access devices 330-1, 330-2, . . . 330-N, in multiple tiers of a 3D memory array. As shown in FIG. 3B, the horizontally oriented access devices each respectively have a first source/drain region 321 and a second source/drain region 323 separated by a channel region 325, and gates 312 separated from channel regions 325 by gate dielectrics 304. As shown in FIG. 3A, and by dashed lines in FIG. 3B, vertically oriented access lines 307 are coupled to the gates 312. Horizontally oriented storage nodes 301 are electrically coupled to the respective second source/drain regions 323 of the horizontally oriented access devices 330. In the example embodiment shown in FIG. 3B, each horizontally oriented storage node 301 has a respective first electrode 361 opposing three different sides, e.g., a horizontally oriented top side, a horizontally oriented bottom side, and a vertically oriented side, of the horizontally oriented access devices 330.

In the example embodiment of FIG. 3B, each horizontally oriented storage node 301 includes an electrical contact between the first electrode 361 of the storage node 301 and a vertical side of the second source/drain regions 323 of the horizontally oriented access devices 330. The first electrodes 361 and the horizontally oriented storage nodes 301 are respectively vertically separated from the horizontally oriented access devices 330. Horizontally oriented digit lines 303 are electrically coupled to the first source/drain regions 321 of the horizontally oriented access devices 330.

In some embodiments of the vertically stacked memory devices, the horizontally oriented storage nodes 301 are capacitors. In other embodiments, the horizontally oriented storage nodes 301 are ferroelectric storage nodes. As shown in FIG. 3B, in some embodiments the first electrodes 361 are opposing three different sides, including a top horizontally oriented side, a bottom horizontally oriented side, and a left and/or right vertically oriented side, of each horizontally oriented access device 330. In some embodiments, the top horizontally oriented side and the bottom horizontally oriented side of each first electrode 361 extend substantially an entire length of the horizontally oriented access devices 330. In some embodiments, as shown in FIG. 3A, the gates 312 of the horizontally oriented access devices 330 comprise gates formed vertically, opposing each side of the channel regions 325, to form gate on two side (G2S) structures.

As shown in the embodiment of FIG. 3B, the horizontally oriented storage nodes 301 are fabricated vertically between the horizontally oriented access devices 330 to reduce a lateral footprint of each memory cell, e.g., access device and storage node, in the array of vertically stacked memory cells for 3D vertically stacked array density.

According to embodiments, the first and the second source/drain regions, 321 and 323, may be impurity doped regions to the horizontally oriented access devices 330. The first and the second source/drain regions may be separated by a channel 325 formed in a body of semiconductor material, e.g., body region 326, of the laterally oriented access devices 330. The first and the second source/drain regions, 321 and 323, may be formed from an n-type or p-type dopant doped in the body region 326. Embodiments are not so limited.

For example, for an n-type conductivity transistor construction, the body region 326 of the laterally oriented access devices 330 may be formed of a low doped (p-) p-type semiconductor material. In some embodiments, the body region 326 and the channel 325 separating the first and the second source/drain regions, 321 and 323, may include a low doped, p-type, e.g., low dopant concentration (p-), polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples.

As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity, e.g., high dopant (n+), doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the laterally oriented access devices 330 may be of a p-type conductivity construction in which case the impurity, e.g., dopant, conductivity types would be reversed.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
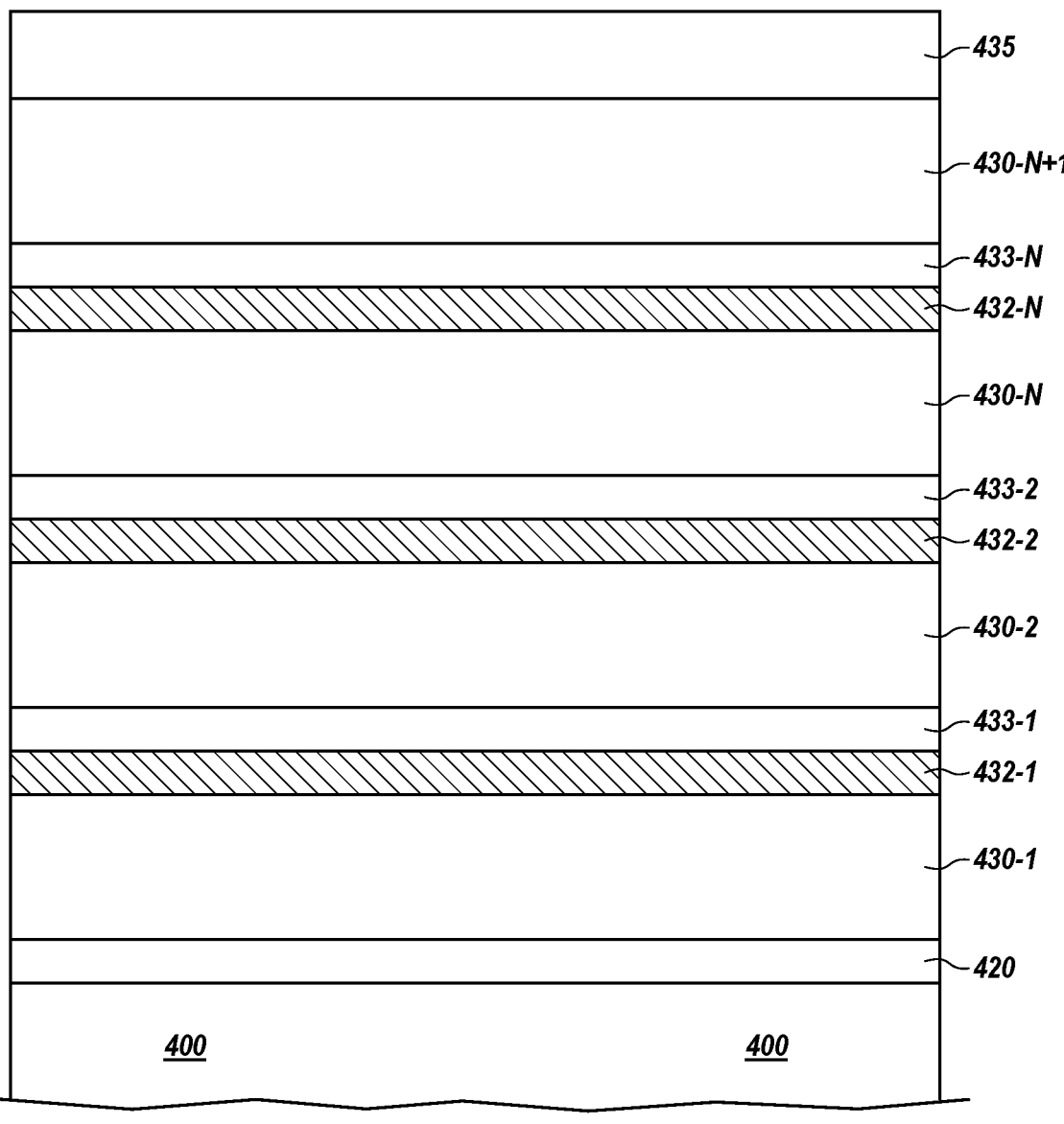
FIG. 4 illustrates a view of a semiconductor structure at a particular time in the fabrication process in accordance with a number of embodiments of the present disclosure.

FIG. 4 is a cross-sectional view, at one stage of a semiconductor fabrication process, for forming vertical digit lines for semiconductor devices having horizontally oriented access devices and horizontally oriented access lines, such as illustrated in FIGS. 1-3, and in accordance with a number of embodiments of the present disclosure.

In the example embodiment shown in the example of FIG. 4, the method comprises depositing alternating layers of a sacrificial material, 430-1, 430-2, . . . , 430-N, a semiconductor material, 432-1, 432-2, . . . , 432-N (collectively referred to as semiconductor material 432), and a first dielectric material, 433-1, 433-2, . . . , 433-N (collectively referred to as first dielectric material 433), in repeating iterations to form a vertical stack 401 on a working surface of a semiconductor substrate 400. The alternating materials in the repeating, vertical stack 401 may be separated from the substrate 400 by an insulator material 420. In one embodiment, the sacrificial material 430 can be deposited to have a thickness, e.g., vertical height in the third direction (D3), in a range of thirty (30) nanometers (nm) to sixty (60) nm. In one embodiment, the first dielectric material 433 can be deposited to have a thickness, e.g., vertical height in the third direction (D3), in a range of ten (10) nm to thirty (30) nm. In one embodiment, the semiconductor material 432 can be deposited to have a thickness (t2), e.g., vertical height, in a range of five (5) nm to thirty (30) nm. Embodiments, however, are not limited to these examples. As shown in FIG. 4, a vertical direction 411 is illustrated as a third direction (D3), e.g., z-direction in an x-y-z coordinate system, analogous to the third direction (D3), among first, second, and third directions, shown in FIGS. 1-3.

In some embodiments, the sacrificial material 430 may be an interlayer dielectric (ILD). By way of example, and not by way of limitation, the sacrificial material 430 may comprise an oxide material, e.g., $SiO_2$. In some embodiments, the first dielectric material, 433-1, 433-2, . . . , 433-N, may comprise a silicon nitride ($Si_3N_4$) material (also referred to herein as "SiN"). In another example the first dielectric material, 433-1, 433-2, . . . , 433-N, may comprise a silicon oxy-carbide ($SiO_xC_y$) material. In another example the first dielectric material, 433-1, 433-2, . . . , 433-N, may include silicon oxy-nitride ($SiO_xN_y$) material (also referred to herein as "SiON"), and/or combinations thereof. Embodiments are not limited to these examples.

In some embodiments, the semiconductor material, 432-1, 432-2, . . . , 432-N, may comprise a silicon (Si) material in a polycrystalline and/or amorphous state. The semiconductor material, 432-1, 432-2, . . . , 432-N, may be a low doped, p-type (p–) silicon material. The semiconductor material, 432-1, 432-2, . . . , 432-N, may be formed by gas phase doping boron atoms (B), as an impurity dopant, at a low concentration to form the low doped, p-type (p–) silicon material. The low doped, p-type (p–) silicon material may be a polysilicon material. Embodiments, however, are not limited to these examples.

The first dielectric material, 433-1, 433-2, . . . , 433-N may be purposefully chosen to be different in material or composition than the sacrificial material, 430-1, 430-2, . . . , 430-N, such that a selective etch process may be performed on the first dielectric material, 433-1, 433-2, . . . , 433-N, e.g, the first dielectric material, 433-1, 433-2, . . . , 433-N, may be selectively etched relative to the semiconductor material, 432-1, 432-2, . . . , 432-N, and the sacrificial, 430-1, 430-2, . . . , 430-N.

The repeating iterations of alternating sacrificial material, 430-1, 430-2, . . . , 430-N, a semiconductor material, 432-1, 432-2, . . . , 432-N, and first dielectric material, 433-1, 433-2, . . . , 433-N may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a sacrificial material, a semiconductor material, and a first dielectric material, in repeating iterations to form the vertical stack 401. The layers may occur in repeating iterations vertically. In the example of FIG. 4, three tiers, numbered 1, 2, and 3, of the repeating iterations are shown.

Figure 5A:
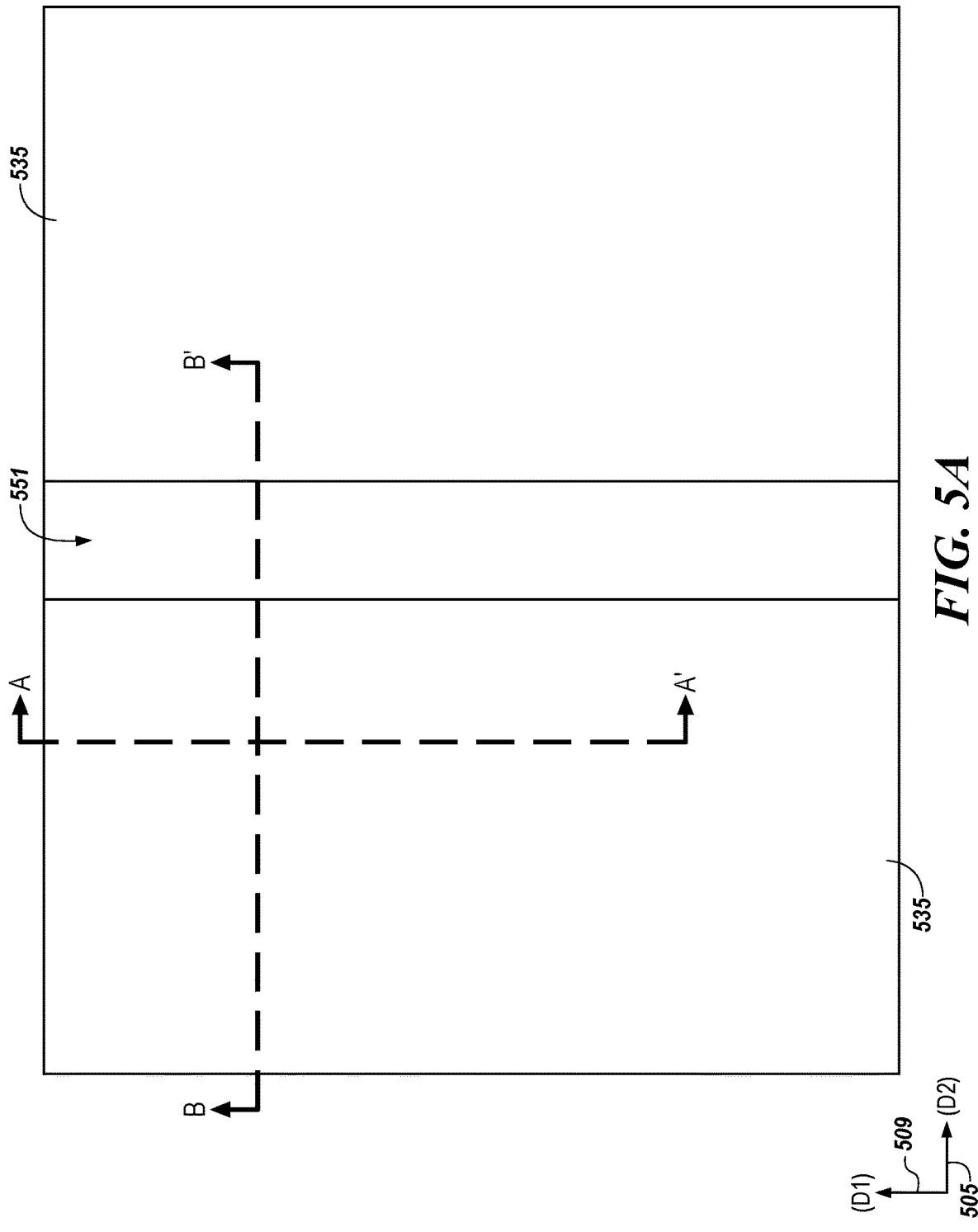

FIG. 5A illustrates an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIG. 5A illustrates a top down view of a semiconductor structure, at a particular point in time, in a semiconductor fabrication process, according to one or more embodiments. In the example embodiment of FIG. 5A, the method comprises using a photolithographic process to pattern the photolithographic mask 535. The method in FIG. 5A further illustrates using one or more etchant processes to form a vertical opening 551, e.g., first vertical opening, in a first region, e.g., storage node region (access side), through the vertical stack (shown in FIGS. 4 and 5B) in a first (D1) 509 and a second (D2) 505 direction. The first vertical opening 551 is illustrated extending predominantly in the first horizontal direction (D1) 509. As shown in FIG. 5C, the one or more etchant processes forms a vertical opening 551 to expose first sidewalls in the repeating iterations of alternating layers of a sacrificial material, 530-1, 530-2, . . . , 530-N, a first dielectric material, 533-1, 533-2, . . . , 533-N a semiconductor material, 532-1, 532-2, . . . , 532-N, and a second dielectric material, 543-1, 543-2, . . . , 543-N, in the vertical stack, shown in FIGS. 5A and 5C, adjacent a first region of the semiconductor material.

In some embodiments, this process is performed after, alternating with, and/or concurrently with the, access device and digit line fabrication processes described in connection with FIGS. 14-20. However, the embodiment shown in FIGS. 5-13 illustrate a sequence in which the storage node fabrication process is performed "before" the access devices, access lines, and digit lines formation.

Figure 6A:
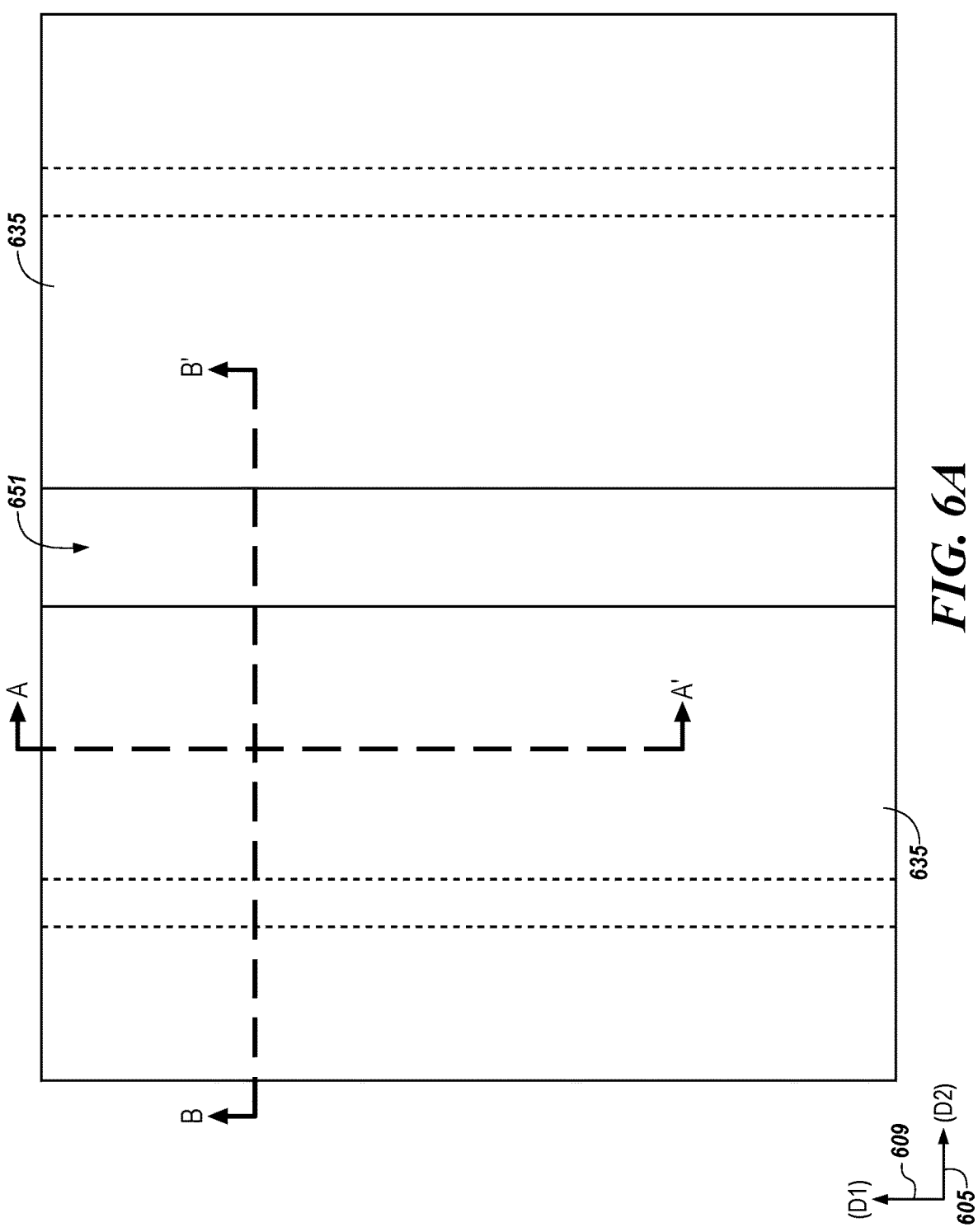

FIGS. 6A-6C illustrate an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIG. 6A is a top down view and FIGS. 6B and 6C illustrate cross sectional views taken along cut lines A-A' and B-B' from FIG. 6A. As illustrated in FIGS. 6B and 6C, an example method comprises forming a first vertical opening 551 in the vertical stack (401 in FIG. 4) and selectively etching the sacrificial material, 630-1, 630-2, . . . , 630-N, a first distance (DIST 1) from the first vertical opening 551 to form first horizontal openings 679 in the vertical stack (shown in FIG. 4). According to embodiments, selectively etching in a first region 544 the sacrificial material, 630-1, 630-2, . . . , 630-N can comprise using an atomic layer etching (ALE) process. As will be explained more in connection with FIG. 8, a second source/drain region (878 in FIG. 8) can be formed in exposed vertical surfaces of semiconductor material, 632-1, 632-2, . . . , 632-N at an end of the first horizontal openings 679 adjacent the first vertical opening (551 in FIG. 5).

FIGS. 7A and 7B illustrates an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure. FIG. 7A is a cross sectional view taken along cut-line A-A' from FIG. 6A and FIG. 7B is a cross section view taken along cut-line B-B' from FIG. 6A.

As shown in the example embodiments of FIGS. 7A and 7B, the method comprises conformally depositing a third dielectric material 737 through the second vertical openings (551 in FIGS. 5A-5C), into the first horizontal openings 779, and onto the exposed surfaces of the remaining sacrificial material, 730-1, 730-2, . . . , 730-N, the first dielectric material, 733-1, 733-2, . . . , 733-N, the vertical ends of the semiconductor material, 732-1, 732-2, . . . , 732-N, and the second dielectric material, 743-1, 743-2, . . . , 743-N, in the vertical stack.

In some embodiments the third dielectric material 737 may be an oxide or other suitable spin on dielectric (SOD), lining the walls of the first vertical openings 551 in FIG. 5A). In another embodiment, the third dielectric material 737 may comprise a nitride material. In another embodiment, third dielectric material 637 may comprise a silicon nitride ($Si_3N_4$) material (also referred to herein as "SiN"). In another embodiment the third dielectric material 637 may include silicon dioxide ($SiO_2$) material. In another embodiment the third dielectric material 637 may comprise a silicon oxy-carbide ($SiO_xC_y$) material, and/or combinations thereof. Embodiments are not limited to these examples.

In some embodiments, the third dielectric material 737 may be deposited to have a thickness in a range of 15 to 30 nanometers (nm). A hard mask 735 is shown over the vertical stack having the third dielectric material 737 deposited thereon. In some embodiments, the third dielectric material 737 may be a same type dielectric material as used for the sacrificial material 730. Embodiments, however, are not so limited.

In one embodiment, the third dielectric material 737 is deposited using an atomic layer deposition (ALD) process. The third dielectric material 737 may serve as a liner around the plurality of first horizontal openings 779. The third dielectric material 737 may be flowed into the first vertical opening (551 in FIG. 5A) and first horizontal openings 779, from where sacrificial material was exhumed in a timed exhumation process the distance (DIST 1) from the first vertical openings.

FIG. 8 illustrates an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIG. 8 illustrates a cross sectional view taken along cut line B-B' from FIG. 6A. As shown in the example embodiment of FIG. 8, the method comprises isotropically etching the third dielectric 837 from vertical sidewalls of the semiconductor material, 832-1, 832-2, . . . , 832-N, and a bottom surface of the first vertical opening (551 in FIG. 5A) to form first source/drain regions 823. According to embodiments the second source/drain regions 823 may be formed by gas phase doping the exposed vertical sidewalls of the semiconductor material, 832-1, 832-2, . . . , 832-N. FIGS. 9A-9B illustrate an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIGS. 9A and 9B illustrate cross sectional views taken along cut lines A-A' and B-B' from FIG. 6A to illustrate storage node formation. As illustrated in FIGS. 9A and 9B, the example method comprises conformally depositing a first electrode 961 on exposed surfaces, through the first vertical openings (551 in FIGS. 5A-5C), onto the exposed vertical surfaces of the gas phase doped second source/drain regions 978, into the first horizontal openings 979 on exposed surfaces of the remaining third dielectric material 937, and on the exposed vertical surfaces of the first dielectric material, 733-1, 933-2, . . . , 933-N and on the second dielectric material, 743-1, 743-2, . . . , 743-N, in the vertical stack.

In one embodiment the first electrode 961 will serve as a bottom electrode 961 for a capacitor cell as the storage node in the first horizontal opening 979. In another embodiment the first electrode will serve as a bottom electrode 961 for a ferroelectric memory cell as the storage node in the first horizontal opening 979. By way of example, and not by way of limitation, conformally depositing the first electrode may include using an atomic layer deposition (ALD) process to sequentially deposit, in the first horizontal opening 979, the first electrode 961.

FIG. 10 illustrates an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIG. 10 illustrates a cross sectional views taken along cut line B-B' from FIG. 6A to illustrate storage node formation. As illustrated in FIG. 10, the example method comprises filling the first vertical opening (551 in FIG. 5A) and the first horizontal openings with a fourth dielectric 1039. In one example embodiment, the fourth dielectric material 1039 may be an oxide or other suitable spin on dielectric (SOD). In some embodiments, the fourth dielectric material 1039 may be a same type dielectric material as used for the sacrificial material 730. Embodiments, however, are not so limited. In another embodiment, the fourth dielectric material 1039 may comprise a nitride material. In another embodiment, fourth dielectric material 1039 may comprise a silicon nitride ($Si_3N_4$) material (also referred to herein as "SiN"). In another embodiment the fourth dielectric material 1039 may include silicon dioxide ($SiO_2$) material. In another embodiment the fourth dielectric material 1039 may comprise a silicon oxy-carbide ($SiO_xC_y$) material, and/or combinations thereof. Embodiments are not limited to these examples.

Figure 11A:
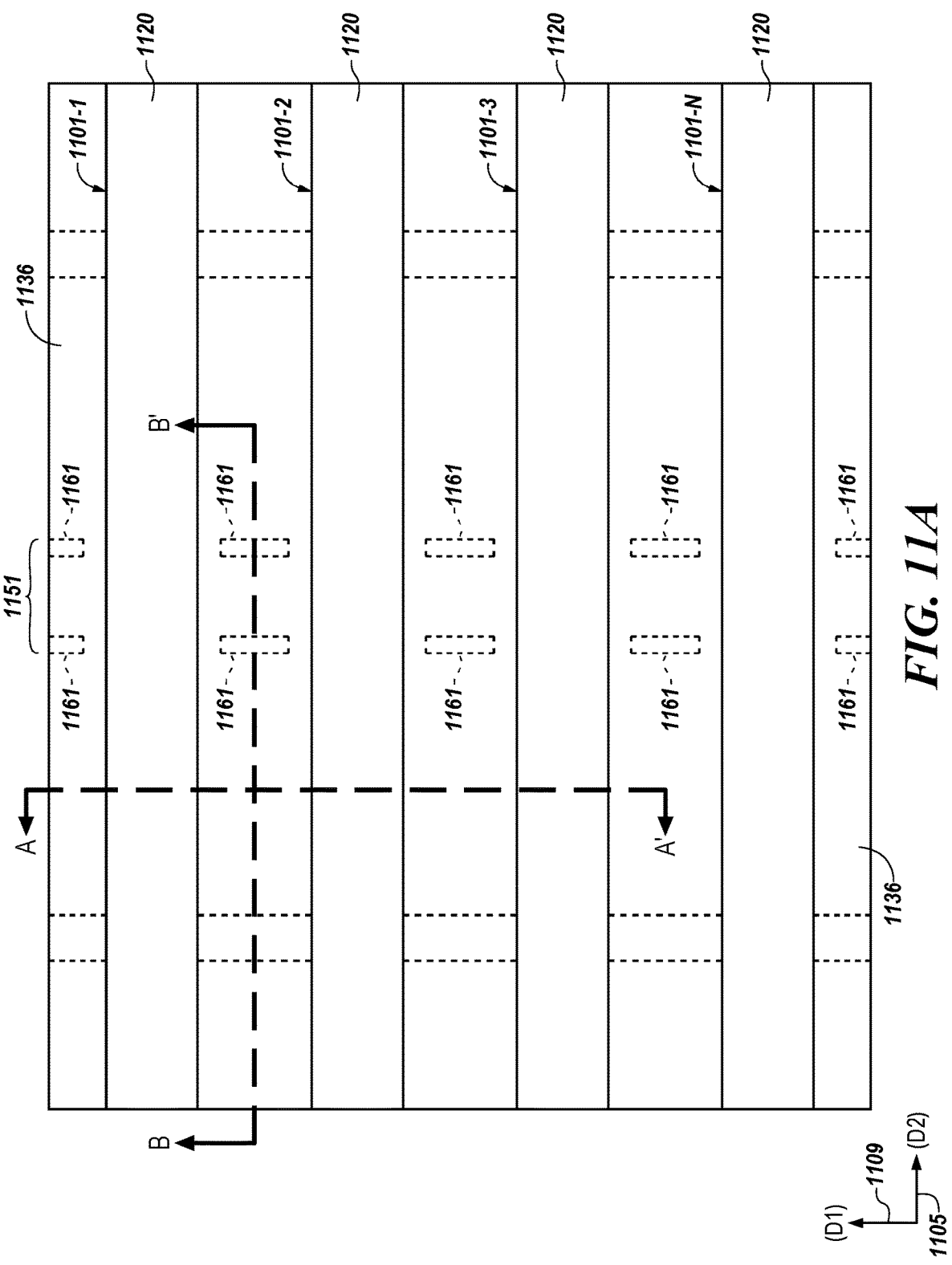

FIGS. 11A-11C illustrate an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIG. 11A illustrates a top down view of a semiconductor structure, at a particular point in time, in a semiconductor fabrication process, according to one or more embodiments. In the example embodiment of FIG. 11A, the method comprises using a photolithographic process to pattern the photolithographic mask 1136. The method in FIG. 11A further illustrates using one or more etchant processes to form a plurality of second vertical openings 1101-1, 1101-2, . . . , 1101-N, e.g., second vertical openings, to separate the first electrode (1061 in FIG. 10) in the in the first direction (D1) 1109, and to form vertically oriented access lines (e.g., 107 in FIG. 1). The second vertical opening 1101 is illustrated extending predominantly in the second horizontal direction (D2) 1105.

In the example embodiment shown in the example of FIG. 11A, the method comprises using an etchant process to form a plurality of second vertical openings 1101, having a first horizontal direction (D1) 1109 and a second horizontal direction (D2) 1105, through the vertical stack to the substrate. In one example, as shown in FIG. 11A, the plurality of second vertical openings 1101 are extending predominantly in the second horizontal direction (D2) 1105 and may form elongated vertical, pillar columns with sidewalls in the vertical stack. The plurality of first vertical openings 1101 may be formed using photolithographic techniques to pattern a photolithographic mask 1135, e.g., to form a hard mask (HM), on the vertical stack prior to etching the plurality of first vertical openings 1101.

FIG. 11B is a cross sectional view, taken along cut-line A-A' in FIG. 11A, showing another view of the semiconductor structure at a particular time in the semiconductor fabrication process. FIG. 11B illustrates that a first electrode 1161 has been separated from along the first horizontal openings in the first direction (D1) 1109. The elongated vertical, pillar columns are shown in this cross sectional view with repeating iterations among the tiers of the second dielectric material 1137, the first electrode 1161, the fill dielectric 1139 from the first vertical openings, and the semiconductor material 1132, and the first dielectric material 1133 to form arrays of vertical stacked memory cells, e.g., stacked storage nodes and access devices.

FIG. 11C illustrates an example embodiment of a cross sectional view taken along cut-line B-B' in FIG. 11A, showing the representation that was shown in FIG. 10 at this example stage of semiconductor fabrication to form arrays of vertical stacked memory cells, e.g., stacked storage nodes and access devices.

FIG. 12 illustrates an example embodiment of a cross sectional view taken along cut-line B-B' in FIG. 11A, showing a deposition of a gate dielectric material 1238 in the plurality of second vertical openings 1201. By way of example and not by way of limitation, a gate dielectric material 1238 may be conformally deposited in the plurality of second vertical openings 1201 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 1238 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 1238 may comprise a silicon dioxide ($SiO_2$) material, aluminum oxide ($Al_2O_3$) material, high dielectric constant (k), e.g, high-k, dielectric material, and/or combinations thereof as also described in FIG. 3.

Figure 13A:
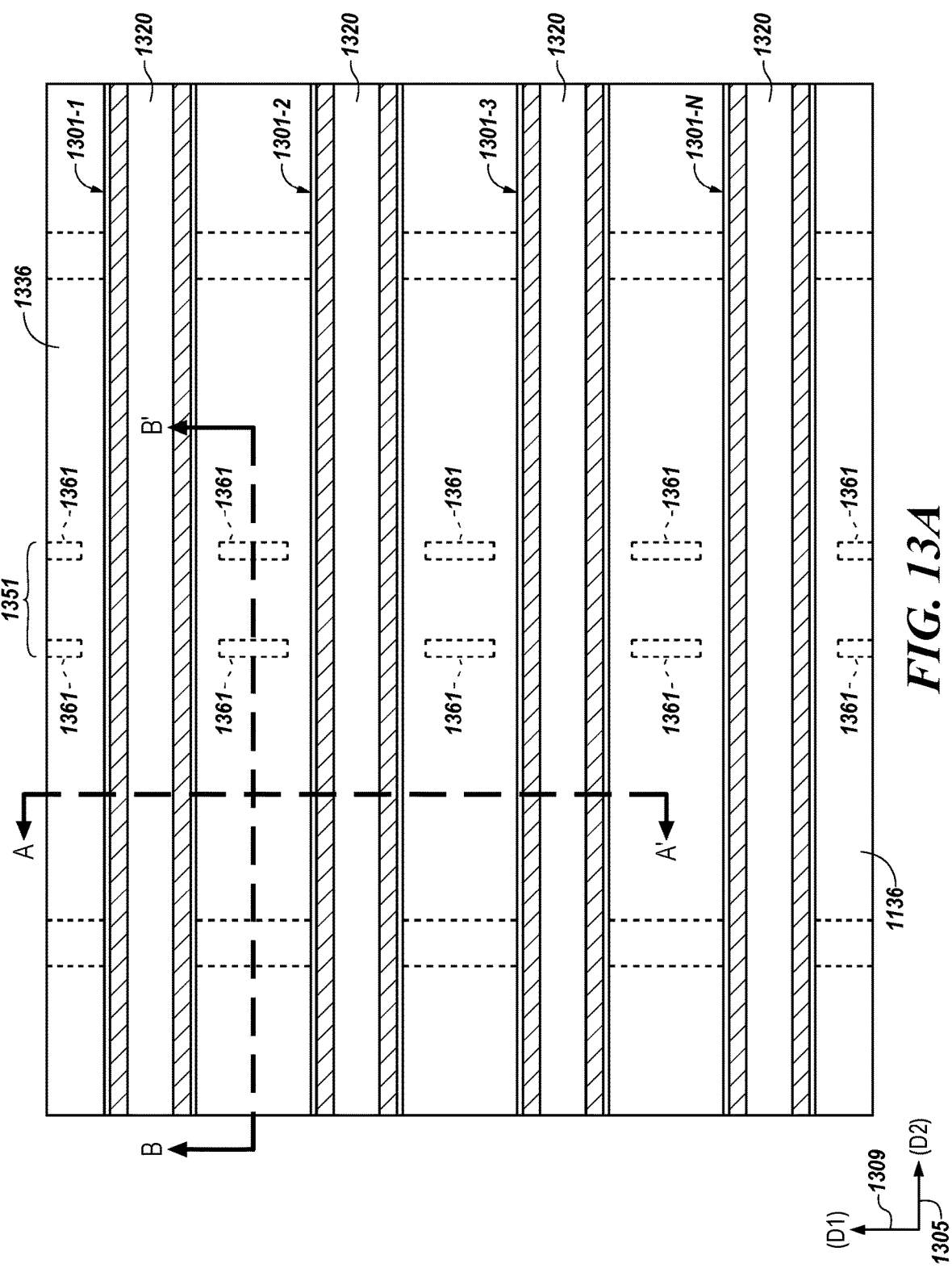

FIGS. 13A-13B illustrate an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

As shown in the example embodiment of FIG. 13A a first conductive material 1340 may be conformally deposited in the plurality of second vertical openings 1301 on a surface of the gate dielectric material 1338. By way of example, and not by way of limitation, the first conductive material 1340 may be conformally deposited in the plurality of second vertical openings 1301 on a surface of the gate dielectric material 1338 using a chemical vapor deposition process (CVD), plasma enhanced CVD (PECVD), atomic layer deposition (ALD), or other suitable deposition process, to cover a bottom surface and the vertical sidewalls of the plurality of second vertical openings 1301 over the gate dielectric 1338. The first conductive material 1340 may be conformally deposited to a particular thickness (t2) to form vertically oriented access lines, such as shown as access lines 107-1, 107-2, . . . , 107-Q (which also may be referred to a wordlines) shown in FIGS. 1, et. seq., and as suited to a particular design rule. For example, the first conductive material 1340 may be conformally deposited to a thickness of approximately 20 nanometers (nm). Embodiments, however, are not limited to this example. By way of example, and not by way of limitation, the first conductive material 1340 may comprise a metal such as tungsten (W), metal composition, titanium nitride (TiN), doped polysilicon, and/or some other combination thereof as also described in FIG. 3.

As shown in FIG. 13B, illustrates a cross sectional view taken along cut-line A-A' in FIG. 13A. The example embodiment of FIG. 13B illustrates that the first conductive material 1340 may be recessed back to remain only along the vertical sidewalls of the elongated vertical, pillar columns, now shown as 1342-1, 13342-2, 1342-3 and 1342-4 in the cross-sectional view of FIG. 13B. The plurality of separate, vertical access lines, 1340-1, 1340-2, . . . , 1340-4, formed from the first conductive material 1340 may be recessed back by using a suitable selective, anisotropic etch process remove the first conductive material 1340 from a bottom surface of the first vertical openings, e.g., leaving the plurality of separate, vertical access lines 1301, 1340-1, 1340-2, . . . , 1340-4, in FIG. 11A, and exposing the gate dielectric 1338 on the bottom surface of the second vertical openings 1301. A dielectric material, e.g., 1339, such as an oxide or other suitable spin on dielectric (SOD), may then be deposited in the first vertical openings 1301, using a process such as CVD, to fill the first vertical openings 1301. The dielectric may be planarized to a top surface of the hard mask 1335 and 1336 of the vertical semiconductor stack, using chemical mechanical planarization (CMP) or other suitable semiconductor fabrication technique. As described next in FIG. 14, a subsequent photolithographic material 1336, e.g., hard mask, may be deposited using CVD and planarized using CMP to cover and close the first vertical openings 1301 over the separate, vertical access lines, 1340-1, 1340-2, . . . , 1340-4. Similar semiconductor process techniques may be used at other points of the semiconductor fabrication process described herein.

Figure 14A:
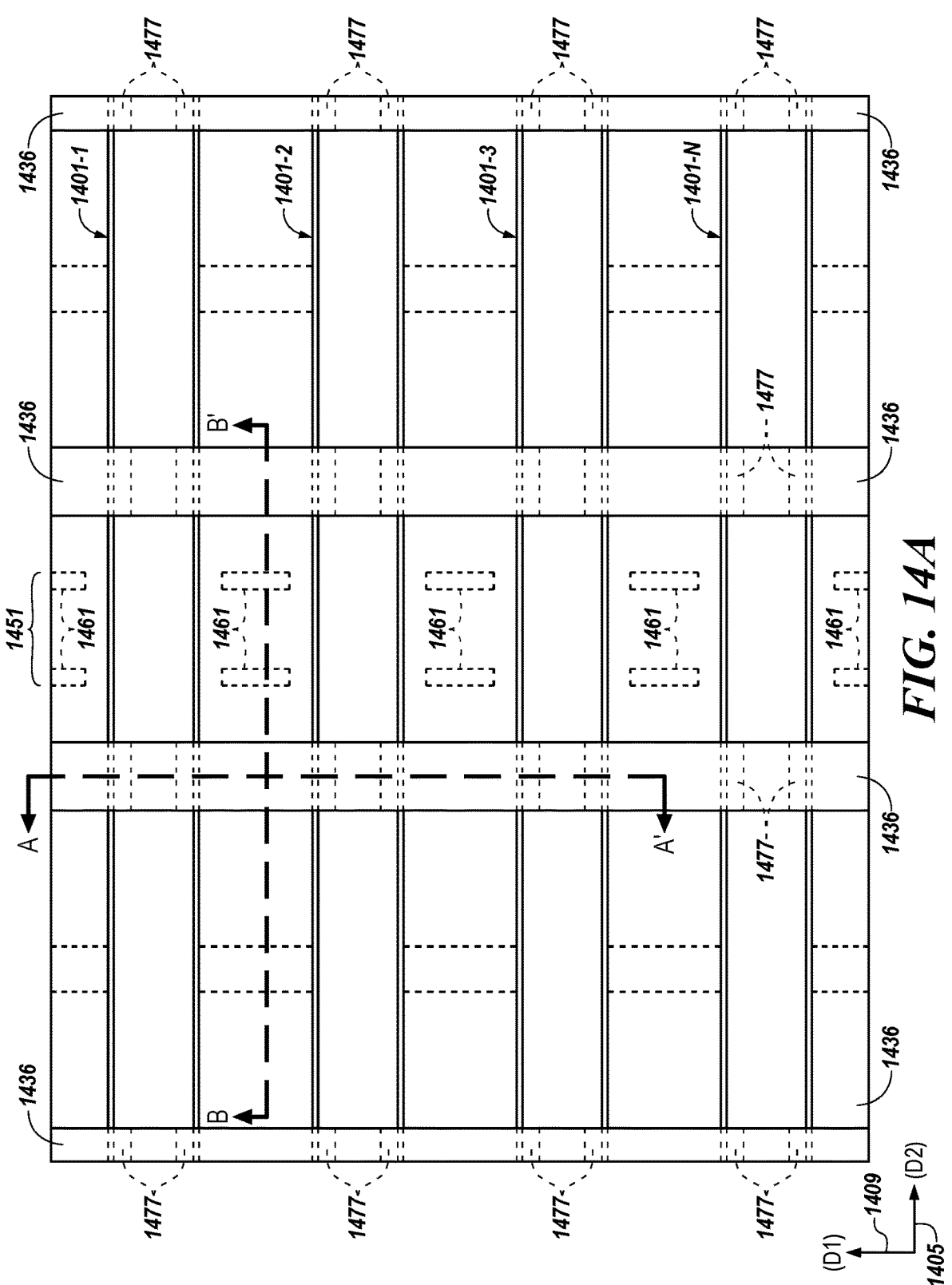
Figure 15A:
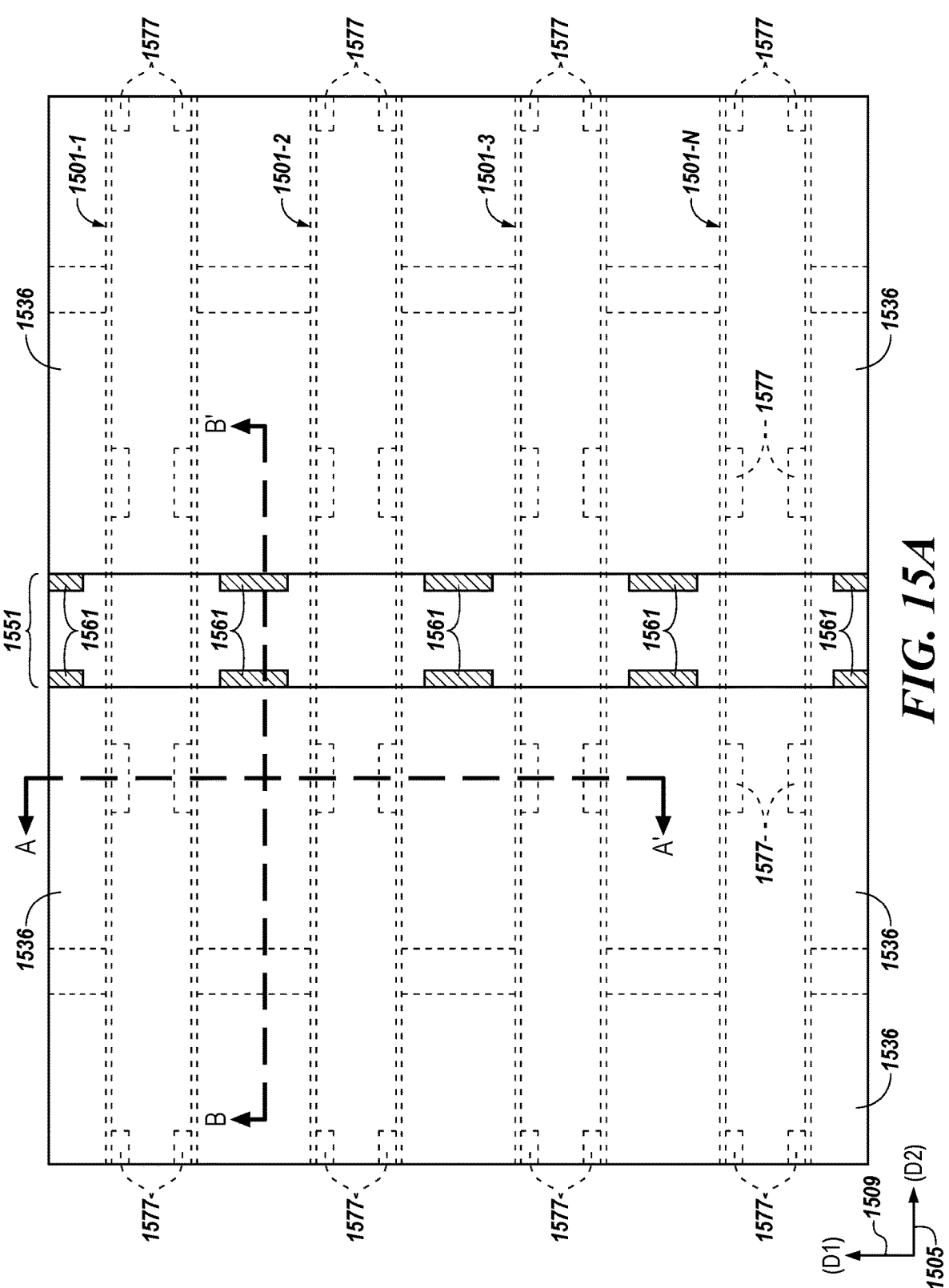

FIGS. 14A-14C illustrate an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure.

FIG. 14A illustrates a top down view of a semiconductor structure, at a particular point in time, in which the method includes using a photolithographic process to pattern the photolithographic mask 1436, 1336 in FIG. 13. The method in FIG. 14A, further illustrates using a selective, isotropic etchant process remove portions of the exposed conductive material such that only portions, 1440-1, 1440-2, . . . , 1440-N, 1440-(N+1), . . . , 1440-(Z−1), and 1440-Z, remain, separated and individually formed as the plurality of separate, vertical access lines, 1440-1, 1440-2, . . . , 1440-N, 1440-(N+1), . . . , 1440-(Z−1), and 1440-Z, e.g., access lines 107-1, 107-2, . . . , 107-Q in FIGS. 1, et. seq. Hence the plurality of separate, vertical access lines, 1340-1, 1440-2, . . . , 1440-N, 1440-(N+1), . . . , 1440-(Z−1), and 1440-Z, are shown along the sidewalls of the elongated vertical, pillar columns, e.g., along sidewalls of the elongated vertical, pillar columns 1442-1, 1442-2, and 1442-3 in the cross-sectional view of FIG. 14B.

As shown in the example of FIG. 14A, the exposed conductive material, 1440-1, 1440-2, . . . , 1440-N, 1440-(N+1), . . . , 1440-(Z−1), and 1440-Z, may be removed back to the gate dielectric material 1438 in the second vertical openings, e.g., 1101 in FIG. 11A, using a suitable selective, isotropic etch process. As shown in FIG. 14A, a subsequent dielectric material 1441, such as an oxide or other suitable spin on dielectric (SOD), may then be deposited to fill the remaining openings from where the exposed conductive material was removed using a process such as CVD, or other suitable technique, leaving the remaining plurality of separate, vertical access lines, 1340-1, 1340-2, . . . , 1440-N, 1440-(N+1), . . . , 1440-(Z−1), and 1440-Z. The dielectric material 1441 may be planarized to a top surface of the previous hard mask 1435 of the vertical semiconductor stack as shown in FIG. 4, using a process such as CMP, or other suitable technique. In some embodiments, a subsequent photolithographic material 1437, e.g., hard mask, may be deposited using CVD and planarized using CMP to cover and close the plurality of separate, vertical access lines, 1440-1, 1440-2, . . . , 1440-N, 1440-(N+1), . . . , 1440-(Z−1), and 1440-Z, over a working surface of the vertical semiconductor stack, as in FIG. 4, leaving the plurality of separate, vertical access lines, 1440-1, 1440-2, . . . , 1440-N, 1440-(N+1), . . . , 1440-(Z−1), and 1440-Z, protected along the sidewalls of the elongated vertical, pillar columns. Embodiments, however, are not limited to these process examples.

FIG. 14B illustrates a cross sectional view, taken along cut-line A-A' in FIG. 14A, showing another view of the semiconductor structure at this particular point in one example semiconductor fabrication process of an embodiment of the present disclosure. The cross sectional view shown in FIG. 14B is away from the plurality of separate, vertical access lines, 1440-1, 1440-2, . . . , 1440-N, 1440-(N+1), . . . , 1440-(Z−1), and shows the repeating iterations among the tiers of the second dielectric material 1437, the first electrode 1461, the fill dielectric 1439 from the first vertical openings, and the semiconductor material 1432, and the first dielectric material 1433 to form arrays of vertical stacked memory cells, e.g., stacked storage nodes and access devices. As shown in FIG. 14B, a vertical direction 1411 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 1409. In the example embodiment of FIG. 14B, the dielectric material 1441 is shown filling the vertical openings on the residual gate dielectric 1438 deposition. The hard mask 1436, described above, caps the illustrated structure.

FIG. 14C illustrates a cross sectional view, taken along cut-line B-B' in FIG. 14A, showing another view of the semiconductor structure at this particular point in one example semiconductor fabrication process of an embodiment of the present disclosure. The cross sectional view shown in FIG. 14C is illustrated extending in the second direction (D2) 1405 along an axis of the repeating iterations among the tiers of the second dielectric material 1437, the first electrode 1461, the fill dielectric 1439 from the first vertical openings, and the semiconductor material 1432, and the first dielectric material 1433 to form arrays of vertical stacked memory cells, e.g., stacked storage nodes and access devices. In FIG. 14C, a neighboring, opposing vertical access line 1440-3 is illustrated by a dashed line indicating a location set in from the plane and orientation of the drawing sheet.

FIGS. 15A-15C illustrate an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIG. 15A illustrates a top down view of a semiconductor structure, at a particular point in time, in a semiconductor fabrication process, according to one or more embodiments. In the example embodiment of FIG. 15A, the method comprises using a photolithographic process to pattern the photolithographic mask 1536. The method in FIG. 15A further illustrates using one or more etchant processes to selectively remove the fourth dielectric (1039 from FIG. 10) from the original first vertical openings 1551 (as shown in FIG. 15C), extending in the first direction (D1) 1505, and the first horizontal openings (979 shown in FIG. 9B). FIG. 15B illustrates the structure in one example embodiment at this particular point in the semiconductor fabrication process, taken along cut-line A-A' in FIG. 15A. FIG. 15C illustrates the structure in one example embodiment at this particular point in the semiconductor fabrication process, taken along cut-line B-B' in FIG. 15A.

As shown in FIG. 15B, taken along cut-line A-A' in FIG. 15A, the masked, selective etch process re-opens the first vertical opening (551 in FIG. 5A) and the first horizontal openings (979 in FIG. 9A) through the repeating iterations of alternating layers of a third dielectric 1537-1, 1537-2, . . . , 1537-N, the first electrode 1561-1, 1561-2, . . . , 1561-N, the first dielectric material, the first dielectric material 1533-1, 1533-2, . . . , 1533-N, the semiconductor material, 1532-1, 1532-2, . . . , 1532-N, and the second dielectric material, 1543-1, 1543-2, . . . , 1543-N, in the vertical stack ascending in the third, vertical direction (D3) 1511.

FIGS. 16A-16C illustrate an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIG. 16A illustrates a top down view of a semiconductor structure, at a particular point in time, in a semiconductor fabrication process, according to one or more embodiments. In the example embodiment of FIG. 16A-16C, the method comprises depositing a second electrode 1656 separated by a cell dielectric 1663. FIG. 16B illustrates a cross sectional view taken along cut-line A-A' in FIG. 16A, and FIG. 16C illustrates a cross sectional view taken along cut-line B-B' in FIG. 16A.

In one embodiment, the cell dielectric 1663 may be conformally deposited on the first electrode 1661 (also referred to as a bottom electrode (BE)) in the first vertical openings, the first horizontal openings, an on other exposed surfaces. In one embodiment, the cell dielectric 1663 may be a high-K dielectric, as described herein, conformally deposited to a thickness (t1) in a range of approximately 2 to 10 nanometers (nm). Embodiments, however, are not limited to this example thickness. Other suitable thicknesses may be achieved.

In one embodiment the second electrode 1656 may be deposited by chemical vapor deposition (CVD), or other suitable technique, on the cell dielectric 1663 in the first vertical openings, the first horizontal openings, an on other exposed surfaces, to fill the first vertical openings. In some embodiments the second electrode 1656 may also be referred to as a top electrode (TE), common electrode (CE), and/or top plate electrode. Embodiments, however, are not limited to these examples. Other suitable semiconductor fabrication techniques and/or storage nodes structures, such as ferroelectric cells, may be used.

Figure 17A:
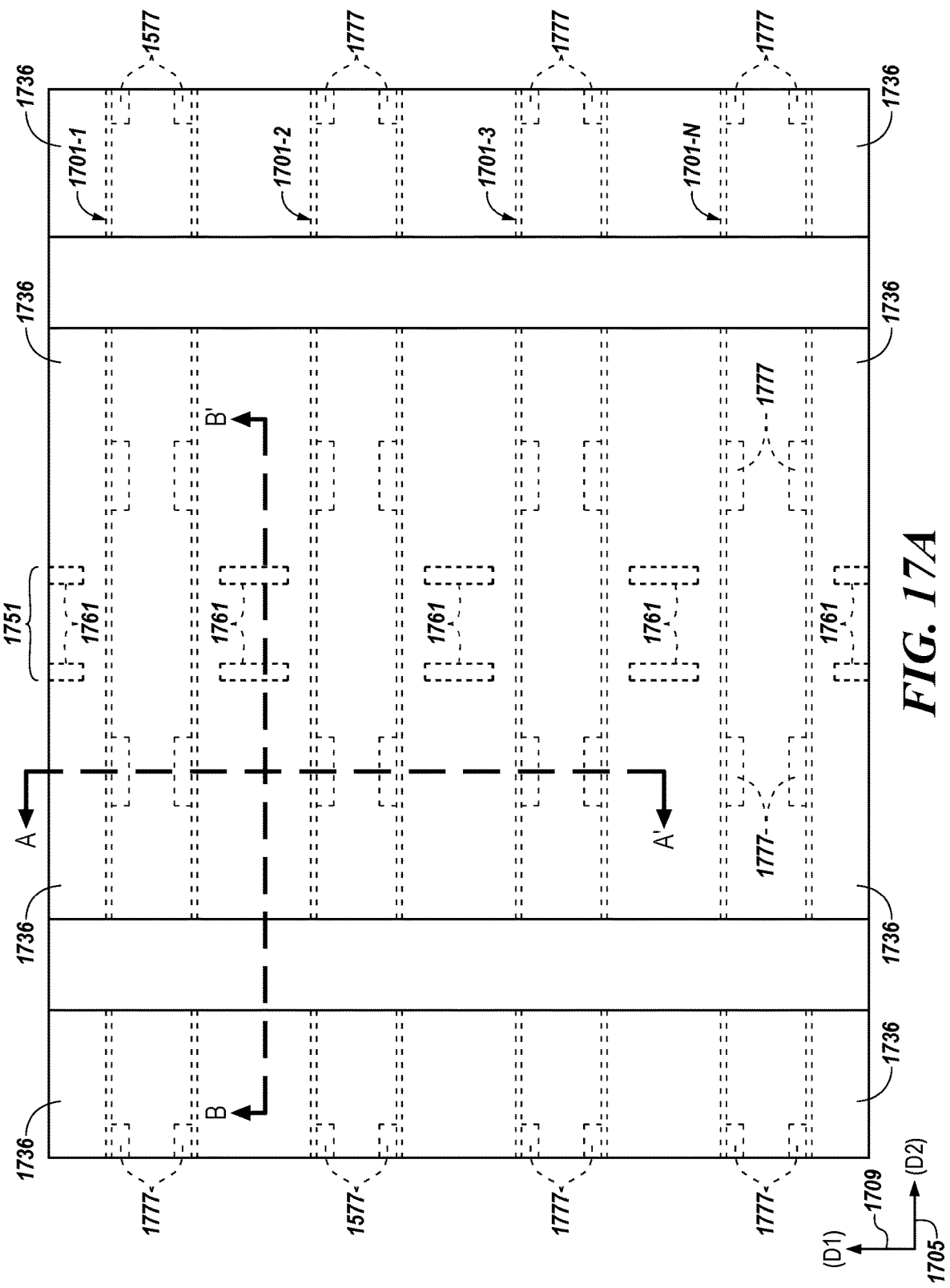
Figure 22:
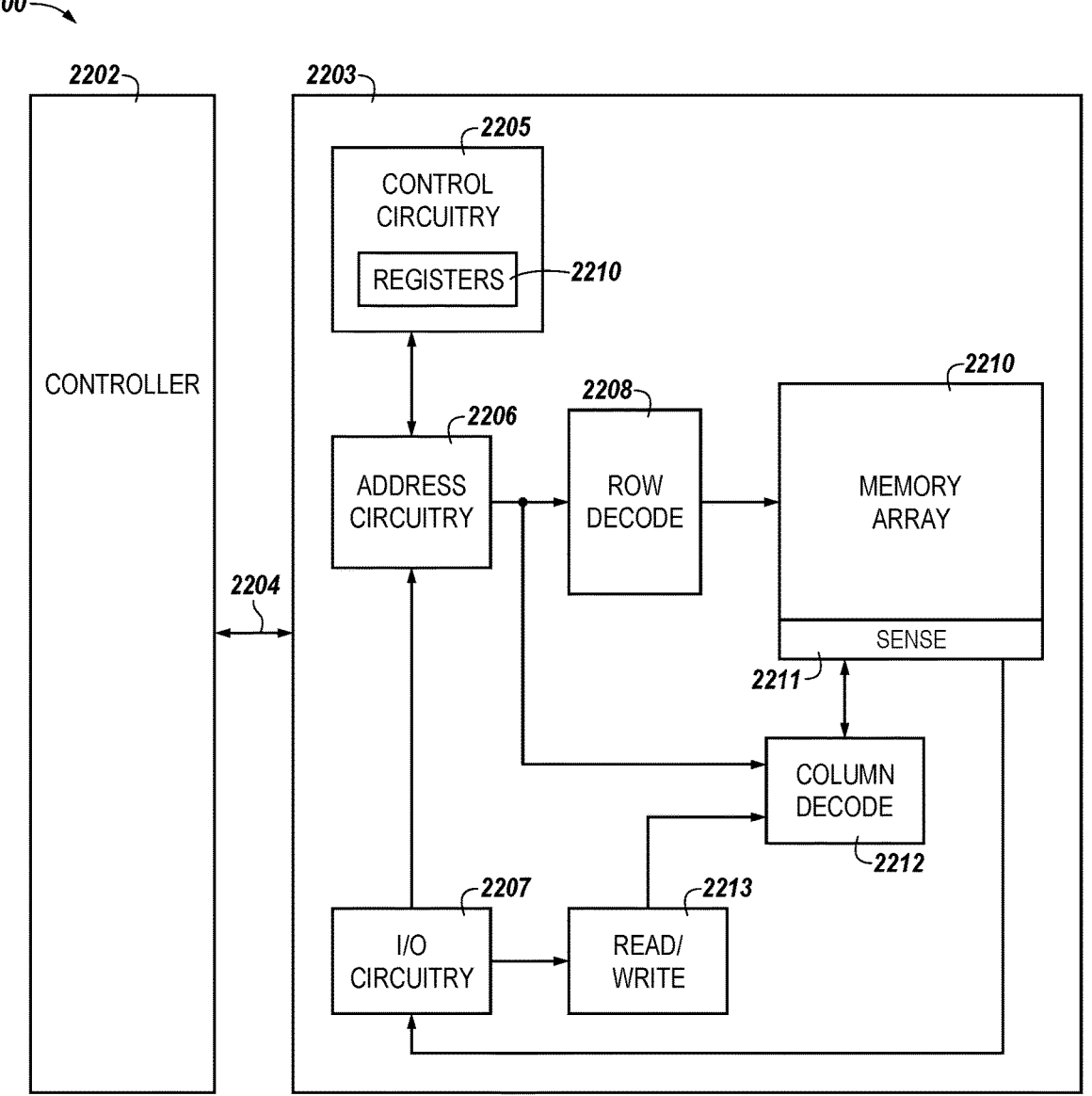

FIGS. 17A-17B illustrate an example method, at another stage of a semiconductor fabrication process, for forming arrays of vertically stacked memory cells, having horizontally oriented access devices and horizontally oriented access lines, such as illustrated in FIGS. 1-3, and in accordance with a number of embodiments of the present disclosure.

FIG. 17A illustrates a top down view of a semiconductor structure, at a particular point in time, in a semiconductor fabrication process, according to one or more embodiments. In the example embodiment of FIG. 17A, the method comprises using a photolithographic process to pattern the photolithographic mask 1736. The method in FIG. 17 further illustrates using one or more etchant processes to form third vertical openings 1770 down through the vertical stack, extending in the first direction (D1) 1705.

FIG. 17B illustrates a cross sectional view taken along cut-line B-B' in FIG. 17A. As illustrated in in FIG. 17B, the etchant processes may additionally selectively remove the fifth dielectric (1139 and 1241 from FIGS. 11 and 12), extending in the first direction (D1) 1705, and the first horizontal openings (979 shown in FIG. 9B).

FIG. 18 illustrates the structure in one example embodiment at this particular point in the semiconductor fabrication process. In the example embodiment of FIG. 18, an etching process may be used to recess sacrificial material (530 in FIG. 5B) horizontally an opening to reach and separate, vertically, the first electrode 1861, on a distal end from the first vertical openings. As shown in the embodiment of FIG. 18, another dielectric material 1878 may be used to then fill the remaining horizontal opening while maintaining the second vertical openings 1870.

FIG. 19 illustrates an example method, at another stage of a semiconductor fabrication process, for forming arrays of vertically stacked memory cells, having horizontally oriented access devices and horizontally oriented access lines with vertically oriented digit lines, such as illustrated in FIGS. 1-3, and in accordance with a number of embodiments of the present disclosure.

FIG. 19 illustrates a cross sectional view of the structure taken along cut-line B-B' in FIG. 19A. In the example embodiment of FIG. 19, the method includes flowing an etchant may be flowed into the second vertical opening 1970 to selectively etch a portion of the first dielectric material 1933 and second dielectric material 1943. For example, an etchant may be flowed into the third vertical opening 1970 to selectively etch a nitride material 1933. The etchant may target all iterations of the first dielectric material 1933 within the stack. As such, the etchant may target the first nitride material 1933 within the stack.

The selective etchant process may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) ($O_2/SO_2$) may be utilized. As another example, a dry etch chemistries of $O_2$ or of $O_2$ and nitrogen ($N_2$) ($O_2/N_2$) may be used to selectively etch the first dielectric material 1933 and second dielectric material 1943. Alternatively, or in addition, a selective etch to remove the first dielectric material 1933 may comprise a selective etch chemistry of phosphoric acid ($H_3PO_4$) or hydrogen fluoride (HF) and/or dissolving the first dielectric material 1933 using a selective solvent, for example $NH_4OH$ or HF, among other possible etch chemistries or solvents.

The selective etchant process may etch the nitride material 1933 to form a second horizontal openings 1973. The selective etchant process may be performed such that the second horizontal opening 1973 has a length or depth (DIST 2) a second distance 1976 from the second vertical opening 1970. The first dielectric material 1933 may be etched a second distance (DIST 2) 1976 in a range of approximately twenty (20) to fifty (50) nanometers (nm) back from the third vertical opening 1970. The second distance (DIST 2) 1976 may be controlled by controlling time, composition of etchant gas, and etch rate of a reactant gas flowed into the second vertical opening 1970, e.g., rate, concentration, temperature, pressure, and time parameters. The selective etch may be isotropic, but selective to the first dielectric material 1933, substantially stopping on the third dielectric material 1937 and the semiconductor material 1932. In this example the horizontal opening 1973 will have a height (H1) substantially equivalent to and be controlled by a thickness, to which the first dielectric layer 1933, e.g., nitride material, was deposited. Embodiments, however, are not limited to this example.

As shown in the example embodiment of FIG. 19 first source/drain regions 1921 are formed in the exposed semiconductor material 1932. In some embodiments a gas phase doping process may then be used to form first source/drain regions 1921 in exposed surfaces of the semiconductor material 1932.

FIG. 20 illustrates an example method, at another stage of a semiconductor fabrication process, for forming arrays of vertically stacked memory cells, having horizontally oriented access devices and vertically oriented access lines with horizontally oriented digit lines, such as illustrated in FIGS. 1-3, and in accordance with a number of embodiments of the present disclosure.

FIG. 20 illustrates a cross sectional view taken along cut-line B-B' in FIG. 19A. In the example embodiment shown in FIG. 20, a second conductive material 2041 may be formed on the first source/drain regions 2021 to serve as horizontally oriented digit lines. In one example embodiment a high doped semiconductor material may be formed vertically through a third vertical openings 2070 as the second conductive material 2041. The second conductive material 2041 may be electrically coupled to the first source/drain region 2021. The second conductive material 2041 may be a high concentration, n-type dopant polysilicon material. For example, the high concentration, n-type dopant may be formed by depositing a highly phosphorus (P) doped (n+ type) polysilicon germanium (SiGe) material as the second conductive material 2041.

In some embodiments the first source/drain region 2021 may be formed by out-diffusing n-type (n+) dopants into the semiconductor material, 2032-1, 2032-2, . . . , 2032-N. For example, the third vertical openings may be adjacent the first source/drain region 2021 and the high concentration, n-type dopant may be out-diffused into the low doped semiconductor material, 2032-1, 2032-2, . . . , 2032-N, using through an annealing process to form the first source/drain regions 2021.

In some embodiments, the second conductive material 2041 may comprise a titanium/titanium nitride (TiN) second conductive material 2041. The TiN second conductive material 2041 may be annealed to form a titanium silicide with the first source/drain regions 2021 of the horizontally oriented access devices.

In some embodiments, the method may include depositing a metal layer to form a bilayer horizontally oriented digit line 2041. In such embodiments a a metal layer such as a cobalt (Co) material layer may be deposited on the titanium/titanium nitride (TiN) second conductive material which forms the titanium silicide 2041 with the first source/drain regions 2021 of the horizontally oriented access devices.

In some embodiments, depositing a metal layer on the second conductive material 2041 may comprise depositing a Ruthenium (Ru) material. In some embodiments, depositing a metal layer on the second conductive material 2041 may comprise depositing a tungsten (W) material. Depositing the metal layer may include chemical vapor deposition, or other suitable deposition technique. Embodiments, however, are not limited to these examples.

FIG. 21 is a block diagram of an apparatus in accordance with a number of embodiments of the present disclosure. FIG. 21 is a block diagram of an apparatus in the form of a computing system 2107 including a memory device 2108 in accordance with a number of embodiments of the present disclosure. As used herein, a memory device 2108, a memory array 2110, and/or a host 2101, for example, might also be separately considered an "apparatus." According to embodiments, the memory device 2101 may comprise at least one memory array 2110 with a memory cell formed having a digit line and body contact, according to the embodiments described herein.

In this example, system 2107 includes a host 2101 coupled to memory device 2108 via an interface 2113. The computing system 2107 can be a personal laptop computer, a desktop computer, a digital camera, a mobile telephone, a memory card reader, or an Internet-of-Things (IoT) enabled device, among various other types of systems. Host 2101 can include a number of processing resources, e.g., one or more processors, microprocessors, or some other type of controlling circuitry, capable of accessing memory 2108. The system 2107 can include separate integrated circuits, or both the host 2101 and the memory device 2108 can be on the same integrated circuit. For example, the host 2101 may be a system controller of a memory system comprising multiple memory devices 2108, with the system controller 2109 providing access to the respective memory devices 2108 by another processing resource such as a central processing unit (CPU).

In the example shown in FIG. 21, the host 2101 is responsible for executing an operating system (OS) and/or various applications, e.g., processes, that can be loaded thereto, e.g., from memory device 2108 via controller 2109. The OS and/or various applications can be loaded from the memory device 2108 by providing access commands from the host 2101 to the memory device 2108 to access the data comprising the OS and/or the various applications. The host 2101 can also access data utilized by the OS and/or various applications by providing access commands to the memory device 2108 to retrieve said data utilized in the execution of the OS and/or the various applications.

For clarity, the system 2107 has been simplified to focus on features with particular relevance to the present disclosure. The memory array 2110 can be a DRAM array comprising at least one memory cell having a digit line and body contact formed according to the techniques described herein. For example, the memory array 2110 can be an unshielded DL 4F2 array such as a 3D-DRAM memory array. The array 2110 can comprise memory cells arranged in rows coupled by word lines, which may be referred to herein as access lines or select lines, and columns coupled by digit lines, which may be referred to herein as sense lines or data lines. Although a single array 2110 is shown in FIG. 8, embodiments are not so limited. For instance, memory device 2108 may include a number of arrays 2110, e.g., a number of banks of DRAM cells.

The memory device 2101 includes address circuitry 2103 to latch address signals provided over an interface 2113. The interface can include, for example, a physical interface employing a suitable protocol, e.g., a data bus, an address bus, and a command bus, or a combined data/address/command bus. Such protocol may be custom or proprietary, or the interface 2113 may employ a standardized protocol, such as Peripheral Component Interconnect Express (PCIe), Gen-Z, CCIX, or the like. Address signals are received and decoded by a row decoder 2106 and a column decoder 2104 to access the memory array 2110. Data can be read from memory array 2110 by sensing voltage and/or current changes on the sense lines using sensing circuitry 2111. The sensing circuitry 2111 can comprise, for example, sense amplifiers that can read and latch a page, e.g., row, of data from the memory array 2110. The I/O circuitry 2112 can be used for bi-directional data communication with the host 2101 over the interface 2113. The read/write circuitry 2105 is used to write data to the memory array 2110 or read data from the memory array 2110. As an example, the circuitry 2105 can comprise various drivers, latch circuitry, etc.

Control circuitry 2109 decodes signals provided by the host 2101. The signals can be commands provided by the host 2101. These signals can include chip enable signals, write enable signals, and address latch signals that are used to control operations performed on the memory array 2110, including data read operations, data write operations, and data erase operations. In various embodiments, the control circuitry 2109 is responsible for executing instructions from the host 2101. The control circuitry 2109 can comprise a state machine, a sequencer, and/or some other type of control circuitry, which may be implemented in the form of hardware, firmware, or software, or any combination of the three. In some examples, the host 2101 can be a controller external to the memory device 2108. For example, the host 2101 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements, e.g., by direct physical contact, indirectly coupled and/or connected with intervening elements, or wirelessly coupled. The term coupled may further include two or more elements that co-operate or interact with each other, e.g., as in a cause and effect relationship. An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction, e.g., the y-direction or the x-direction, that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A three-dimensional memory device, comprising:
an array of vertically stacked memory cells, the array of vertically stacked memory cells, comprising:
horizontally oriented access devices each respectively having a first source/drain region and a second source/drain region separated by a channel region, and gates separated from channel regions by gate dielectrics;
horizontally oriented storage nodes electrically coupled to the respective second source/drain regions of the horizontally oriented access devices and each having a respective first electrode opposing two different sides of respective horizontally oriented access devices including having an electrical contact with a vertical side of the second source/drain region of respective horizontally oriented access devices, and wherein the horizontally oriented storage nodes are vertically separated from the respective horizontally oriented access devices;
wherein the first electrode opposes three different sides, including a top horizontally oriented side, a bottom horizontally oriented side, and a left and/or right vertically oriented side, of each horizontally oriented access device;
wherein the top horizontally oriented side and the bottom horizontally oriented side of each first electrode extends substantially an entire length of the horizontally oriented access devices; and horizontally oriented digit lines electrically coupled to the first source/drain regions of the horizontally oriented access devices.

2. The memory device of claim 1, wherein the horizontally oriented storage nodes are capacitors.

3. The memory device of claim 1, wherein the horizontally oriented storage nodes are ferroelectric storage nodes.

4. The memory device of claim 1, where the gates of the horizontally oriented access devices comprise gates formed vertically, opposing each side of the channel regions, to form gate on two side (G2S) structures.

5. The memory device of claim 4, wherein the vertically formed gates are connected to vertically formed access lines.

6. The memory device of claim 1, wherein the horizontally oriented storage nodes are metal-insulator-metal capacitors.

7. A three-dimensional memory device, comprising:
an array of vertically stacked memory cells, the array of vertically stacked memory cells, comprising:
horizontally oriented access devices each respectively having a first source/drain region and a second source/drain region separated by a channel region, and gates separated from channel regions by gate dielectrics;
horizontally oriented storage nodes electrically coupled to the respective second source/drain regions of the access devices, wherein the horizontally oriented storage nodes are respectively, vertically separated from the horizontally oriented access devices, the storage nodes each having a respective first electrode that extends substantially along an entire length of a top side and a bottom side of the horizontally oriented access devices, and
horizontally oriented digit lines electrically coupled to the first source/drain regions of the horizontally oriented access devices.

8. The three-dimensional memory device of claim 7, wherein the horizontally oriented storage nodes each having a respective second electrode that extends along an entire length of the horizontally oriented access devices between respective tiers of the horizontally oriented access devices.

9. The three-dimensional memory device of claim 7, wherein each respective first electrode includes an electrical contact with a vertical side of the second source/drain regions of the horizontally oriented access devices.

10. The three-dimensional memory device of claim 7, further comprising gates formed vertically opposing each side of the channel regions to form gate on two side (G2S) structures.

11. A memory device, comprising:
a first memory cell, comprising;
a first horizontally oriented access device having a first source/drain region and a second source/drain region separated by a first channel region, the first access device being operatively controlled by a vertically oriented gate; and
a first storage node comprising a first electrode coupled to the second source/drain region of the first access device, at least a portion of the first electrode being over the first access device;
a second memory cell over the first memory cell and comprising;
a second horizontally oriented access device having a first source/drain region and a second source/drain region separated by a second channel region, the second access device also being operatively controlled by the vertically oriented gate; and

a second storage node comprising a first electrode coupled to the second source/drain region of the second access device, at least a portion of the first electrode being over the second access device; and wherein the first and the second storage nodes share a common electrode that is located vertically between the portion of the first electrode of the first storage node that is over the first access device and at least a portion of the first electrode of the second storage node;

wherein the first electrode of the first storage node and the first electrode of the second storage node oppose three different sides, including a top horizontally oriented side, a bottom horizontally oriented side, and a left and/or right vertically oriented side, of each horizontally oriented access device;

wherein the top horizontally oriented side and the bottom horizontally oriented side of each the first electrode of the first storage node and the first electrode of the second storage node extend substantially an entire length of the horizontally oriented access devices.

12. The memory device of claim 11, further comprising a first horizontally oriented digit line coupled to the first source/drain region of the first access device and a second horizontally oriented digit line coupled to the first source/drain region of the second access device.

13. The memory device of claim 11, further comprising dielectric material vertically between the common electrode and the portion of the first electrode of the first storage node that is over the first access device.

14. The memory device of claim 11, further comprising dielectric material vertically between the common electrode and the portion of the first electrode of the second storage node.

15. The memory device of claim 11, wherein another portion of the first electrode of the first storage node is under the first access device.

16. The memory device of claim 11, wherein the first electrode of the second storage node partially wraps around the second access device.

17. The memory device of claim 11, wherein the channel regions comprise silicon.

* * * * *